(12) United States Patent
Taylor et al.

(10) Patent No.: US 9,178,507 B2
(45) Date of Patent: Nov. 3, 2015

(54) APPARATUS AND METHODS FOR ULTRASOUND TRANSMIT SWITCHING

(71) Applicant: ANALOG DEVICES, INC., Norwood, MA (US)

(72) Inventors: Gerard E Taylor, Laguna Niguel, CA (US); Allen R Barlow, San Diego, CA (US); Corey D Petersen, Poway, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/687,739

(22) Filed: Nov. 28, 2012

(65) Prior Publication Data
US 2014/0145781 A1 May 29, 2014

(51) Int. Cl.
*H03K 17/687* (2006.01)
*H03K 17/30* (2006.01)
(52) U.S. Cl.
CPC .................................. *H03K 17/302* (2013.01)
USPC .......................................... 327/427; 327/430
(58) Field of Classification Search
CPC .... H05B 37/02; H05B 33/0818; G03G 15/80; H01L 2924/00014; H01L 33/0815; G05F 3/02
USPC .................. 323/311, 282, 312; 315/122, 186, 315/200 R, 119, 193, 201, 307, 116, 154, 315/169.4, 192, 206, 224, 283, 287; 327/109, 108, 194, 298, 310, 315, 321, 327/324, 333, 365, 375, 379, 380, 419, 427, 327/430, 432, 434, 538, 543, 79, 85; 361/56, 87, 115, 18, 35, 36, 679.32, 361/91.1, 91.6
See application file for complete search history.

(56) References Cited

U.S. PATENT DOCUMENTS

| | | | |
|---|---|---|---|
| 3,521,087 | A | 7/1970 | Lombardi |
| 5,603,324 | A | 2/1997 | Oppelt et al. |
| 5,634,200 | A | 5/1997 | Kitakubo et al. |
| 5,659,885 | A | 8/1997 | McDonald et al. |
| 6,083,164 | A | 7/2000 | Oppelt et al. |
| 6,759,888 | B1 | 7/2004 | Wodnicki |
| 7,139,532 | B2 | 11/2006 | Veillette |

(Continued)

OTHER PUBLICATIONS

Odom, "Ultrasound Analog Electronics Primer," Analog Dialogue, 1999, pp. 1-3, vol. 33-5.

*Primary Examiner* — Lincoln Donovan
*Assistant Examiner* — Diana J Cheng
(74) *Attorney, Agent, or Firm* — Knobbe Martens Olson & Bear LLP

(57) ABSTRACT

Apparatus and methods for ultrasound transmit switching are provided. In certain implementations, a transmit switch includes a bias polarity control circuit, a bias circuit, a first high voltage field effect transistor (HVFET), and a second HVFET. The sources of the first and second HVFETs are connected to one another at a source node, the gates of the first and second HVFETs are connected to one another at a gate node, and the drains of the first and second HVFETs are connected to an input terminal and an output terminal, respectively. The bias circuit and the bias polarity control circuit are each electrically connected between the source node and the gate node. The bias polarity control circuit can turn on or off the HVFETs by controlling a polarity of a bias voltage across the bias circuit, such as by controlling a direction of current flow through the bias circuit.

15 Claims, 16 Drawing Sheets

(56) References Cited

U.S. PATENT DOCUMENTS

| | | |
|---|---|---|
| 7,262,946 B2 | 8/2007 | Harris et al. |
| 7,271,452 B2 | 9/2007 | Arai |
| 7,314,445 B2 | 1/2008 | Wodnicki et al. |
| 7,324,315 B2 | 1/2008 | Harris |
| 7,342,433 B2 | 3/2008 | Harris et al. |
| 7,375,942 B1 | 5/2008 | Harris |
| 7,492,566 B2 | 2/2009 | Harris |
| 7,576,962 B2 | 8/2009 | Harris |
| 7,646,576 B2 | 1/2010 | Harris et al. |
| 8,265,569 B2 | 9/2012 | Barlow |
| 2005/0154300 A1 | 7/2005 | Wodnicki et al. |
| 2006/0098363 A1 | 5/2006 | Hebert et al. |
| 2006/0098373 A1 | 5/2006 | Hebert et al. |
| 2006/0260400 A1 | 11/2006 | Goldstein |
| 2006/0281418 A1 | 12/2006 | Huang et al. |
| 2008/0262357 A1 | 10/2008 | Wodnicki |
| 2009/0115549 A1 | 5/2009 | Lee |
| 2011/0063011 A1* | 3/2011 | Barlow ........................ 327/328 |

* cited by examiner

APPARATUS AND METHODS FOR ULTRASOUND TRANSMIT SWITCHING

CROSS-REFERENCE TO RELATED APPLICATIONS

This application is related to U.S. application Ser. No. 13/687,654, entitled "APPARATUS AND METHODS FOR ULTRASOUND PROBES" (Inventors: Allen R. Barlow, Gerard E. Taylor, and Corey D. Petersen, filed on even date herewith), the disclosure of which is incorporated herein by reference in its entirety.

BACKGROUND

1. Field

Embodiments of the invention relate to electronic systems, and more particularly, to ultrasound probes.

2. Description of the Related Technology

An ultrasound system can include a transmitter configured to generate a transmit signal, and a transducer configured to convert the transmit signal into an acoustic or ultrasound signal that can propagate through a transmission medium, such as air or liquid. The ultrasound signal can be reflected by objects in the transmission medium to generate an echo signal. The transducer can convert the echo signal into a receive signal, which can be processed by a receiver of the ultrasound system.

The ultrasound system's transmitter and receiver can be configured to share the transducer and the channel leading to the transducer. During operation, however, the transmitter and the receiver can alternately use the transducer and the channel. For example, during a transmit mode the transmitter can generate and transmit a transmit signal through the channel to the transducer. Additionally, during a receive mode the receiver can detect and process a receive signal sent from the transducer to the receiver through the channel.

The transmit signal generated by the ultrasound system's transmitter can be a high voltage signal suitable for conversion into an ultrasound signal by the transducer during a short transmit period. At least a portion of the ultrasound signal may be reflected by an object, and may be detected and converted into a low voltage receive signal by the transducer during a relatively long receive period. Thus, the transmit signal can be a high voltage signal and the receive signal can be a low voltage signal. Such an ultrasound system may be used as, for example, a medical imaging system. In other instances, such an ultrasound system may be used for various other purposes, for example, for determining a distance between objects, a level of a material in a container, or detection of voids and cracks.

SUMMARY

In one embodiment, a transmit switch includes a first terminal, a second terminal, a first field effect transistor (FET), a second FET, a bias circuit, and a bias polarity control circuit. The first FET includes a drain electrically connected to the first terminal, a gate electrically connected to a gate node, and a source electrically connected to a source node. The second FET includes a drain electrically connected to the second terminal, a source electrically connected to the source node, and a gate electrically connected to the gate node. The bias circuit is electrically connected between the gate node and the source node, and the bias polarity control circuit is electrically connected between the gate node and the source node and is configured to receive a control signal. The bias polarity control circuit is configured to turn on the first and second FETs by generating a bias voltage across the bias circuit when the control signal indicates that the transmit switch should be enabled. Additionally, the bias polarity control circuit is configured to turn off the first and second FETs by reversing a polarity of the bias voltage when the control signal indicates that the transmit switch should be disabled.

In another embodiment, a transmit switch includes a first terminal, a second terminal, a first FET, a second FET, a means for biasing, and a means for bias polarity control. The first FET includes a drain electrically connected to the first terminal, a gate electrically connected to a gate node, and a source electrically connected to a source node. The second FET includes a drain electrically connected to the second terminal, a source electrically connected to the source node, and a gate electrically connected to the gate node. The biasing means is electrically connected between the gate node and the source node, and the bias polarity control means is electrically connected between the gate node and the source node and is configured to receive a control signal. The bias polarity control means is configured to turn on the first and second FETs by generating a bias voltage across the biasing means when the control signal indicates that the transmit switch should be enabled. Additionally, the bias polarity control means is configured to turn off the first and second FETs by reversing a polarity of the bias voltage when the control signal indicates that the transmit switch should be disabled.

In another embodiment, a method of switching in an ultrasound probe is provided. The method includes receiving an ultrasound transmit signal on an input terminal of a transmit switch. The transmit switch includes a first FET and a second FET. The first FET includes a drain electrically connected to the input terminal, a gate electrically connected to a gate node, and a source electrically connected to a source node, and the second FET includes a drain electrically connected to an output terminal, a source electrically connected to the source node, and a gate electrically connected to the gate node. The method further includes receiving a control signal into a control terminal of the transmit switch. The method further includes switching on the transmit switch when the control signal indicates that that the transmit switch should be enabled, and switching off the transmit switch when the control signal indicates that the transmit switch should be disabled. Additionally, switching on the transmit switch includes turning on the first and second FETs by generating a bias voltage across a bias circuit electrically connected between the gate node and the source node. Additionally, switching off the transmit switch comprises turning off the first and second FETs by reversing a polarity of the bias voltage across the bias circuit.

DETAILED DESCRIPTION OF EMBODIMENTS

Figure 1:
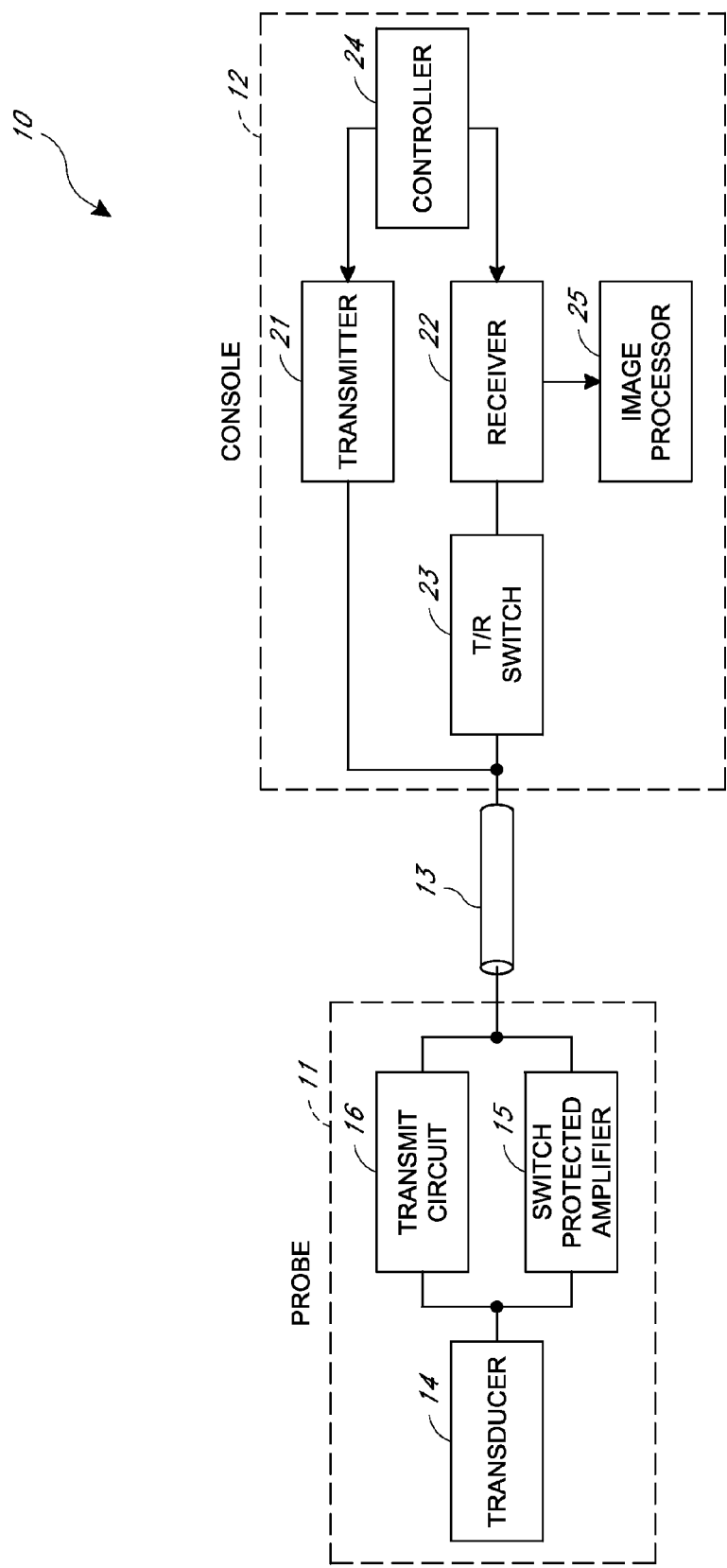
FIG. 1 is a schematic block diagram of one embodiment of an ultrasound system.

The following detailed description of embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Ultrasound Probes Including Switch Protected Amplifiers

Configuring the transmitter and the receiver of an ultrasound system to share a transducer and a channel or cable leading to the transducer can reduce the ultrasound system's cost. For example, using bidirectional signaling over the channel can reduce the physical size of an ultrasound probe housing the transducer as well as cable expense. Since typical ultrasound systems include multiple channels, such as 128 or more channels, configuring the channels to operate bidirectionally can provide a significant size and/or cost savings.

During transmit, a transmit signal having relatively high voltage is sent from the transmitter to the transducer through a cable associated with a channel. As used herein, the term "high voltage" refers to voltages that are higher than those typically encountered in integrated circuits and does not refer to "high voltage" as used in electrical power transmission. In one example, a high voltage transmit signal can have a peak-to-peak voltage in the range of about 10 V to about 200 V. However, other voltage ranges will be readily determined by one of ordinary skill in the art. The transducer converts the high voltage transmit signal into an ultrasound signal, which can be reflected back in all or part to generate an echo signal. Losses in the transmission medium can attenuate the amplitude of the echo signal relative to the amplitude of the ultrasound signal. Thus, the receive signal generated by the transducer in response to the echo signal can have a relatively small voltage, such as a peak-to-peak voltage in the range of about 1 µV to about 500 mV. However, other voltage ranges will be readily determined by one of ordinary skill in the art.

Ultrasound cables can be relatively long, such as 2 meters or more, and can present a relatively large parasitic load that can attenuate the low voltage receive signal. Accordingly, it can be desirable to provide a buffer or amplifier in the ultrasound probe near the transducer to amplify the receive signal before the receive signal is transmitted along the cable. However, since the transmitter and the receiver can share the same cable, any amplifier present in the ultrasound probe should be protected from the high voltage transmit signal.

The difficulty in integrating an amplifier into the ultrasound probe can be exacerbated by the probe's heat and/or power specifications. For example, in medical imaging applications, the ultrasound probe can be in physical contact with the human body, and thus can have stringent heat and power limitations. Since an ultrasound probe can include many channels, the power available for each channel can be relatively small. Accordingly, it can be difficult to obtain adequate performance from the amplifier even when the amplifier uses a relatively large portion of the power available to the channel.

Provided herein are apparatus and methods for ultrasound probes. In certain implementations, an ultrasound probe includes a transducer, a switch protected amplifier, and a transmit circuit. The switch protected amplifier and the transmit circuit are electrically connected in parallel between the transducer and a cable port used to connect the ultrasound probe to an ultrasound console using a cable. The transmit circuit can pass a high voltage transmit signal received on the cable to the transducer so that the transducer can generate an ultrasound signal. The switch protected amplifier includes an amplifier electrically connected between first and second high voltage receive switches, which can be used to protect the amplifier from the high voltage transmit signal by blocking the transmit signal from reaching the amplifier's input and output. However, the high voltage receive switches can be used to pass a receive signal generated by the transducer in response to an echo signal, thereby allowing the amplifier to amplify the receive signal for transmission to the ultrasound console over the cable.

In certain implementations, the high voltage receive switches can be configured to open and close in response to sensed or detected voltage conditions. For example, the high voltage receive switches can be configured to turn off or open when positive or negative high voltage conditions are detected. However, the high voltage receive switches can be configured to turn on or close when no positive or negative high voltage conditions are detected, thereby allowing the amplifier to amplify the receive signal. Configuring the high voltage receive switches to be able to operate automatically can avoid the need to send switch control signals to the receive switches via cables, thereby reducing the overall cost of the ultrasound system.

In some embodiments, a high voltage receive switch includes a first high voltage field effect transistor (HVFET) and a second HVFET electrically connected in series between a high voltage terminal and a low voltage terminal. For example, the sources of the first and second HVFETs can be connected to one another, and the drain of the first HVFET can be connected to the high voltage terminal and the drain of the second HVFET can be connected to the low voltage terminal. Additionally, the high voltage receive switch includes a gate bias circuit, a positive threshold detection and control circuit, and a negative threshold detection and control circuit. The gate bias circuit can be used to bias the gates of the first and second HVFETs so as to turn on the first and second HVFETs when no positive or negative high voltage conditions are detected on the high voltage terminal, thereby allowing low voltage signals to pass from the high voltage terminal to the low voltage terminal. However, when the voltage of the high voltage terminal is greater than a positive threshold voltage, the positive threshold detection and control circuit can be used to turn off at least one of the first and second HVFETs. Additionally, when the voltage of the high voltage terminal is less than a negative threshold voltage, the negative threshold voltage and control circuit can turn off at least one of the first and second HVFETs.

The switch protected amplifiers described herein can be used to provide an ultrasound probe with an integrated amplifier for amplifying a receive signal for transmission over a cable. The switch protected amplifiers include high voltage switches that can be used to protect the amplifier, thereby allowing the amplifier to be fabricated using high performance low voltage transistors. In one embodiment, "high voltage" can refer to, for example, transistors or other circuitry configured to withstand voltage conditions of up to about 150 V, while "low voltage" can refer to transistors or other circuitry configured to withstand voltage conditions of about 8 V. Other applicable voltage ranges will be readily determined by one of ordinary skill in the art. The high voltage receive switches can protect receive amplification circuitry that shares a channel with transmit circuitry by turning off or opening when high voltage conditions are detected. The switch protected amplifier can consume a relatively small amount of power, and timing of the protection switching can operate without a need for control signals, thereby avoiding overhead associated with providing additional cables for control signaling.

FIG. 1 is a schematic block diagram of one embodiment of an ultrasound system 10. The ultrasound system 10 includes an ultrasound probe 11, an ultrasound console 12, and a cable 13.

The ultrasound probe 11 is electrically coupled to the ultrasound console 12 using the cable 13, and the ultrasound probe 11 can be used to transmit and receive acoustic signals into and from a transmission medium. The ultrasound probe 11 includes a transducer 14, a switch protected amplifier 15, and a transmit circuit 16. The switch protected amplifier 15 and the transmit circuit 16 are electrically connected in parallel between the transducer 14 and the cable 13. For example, the switch protected amplifier 15 and the transmit circuit 16 each include a first terminal electrically connected to the transducer 14 and a second terminal electrically connected to the cable 13.

The ultrasound probe 11 can receive a high voltage transmit signal from the ultrasound console 12 over the cable 13. The high voltage transmit signal can be provided to the transducer 14 using the transmit circuit 16. The high voltage transmit signal can be received by the transducer 14, which can generate an ultrasound signal in response to the high voltage transmit signal. In certain implementations, the transducer 14 can be formed of a piezoelectric ceramic material configured to generate an ultrasound signal in response to an applied voltage. The ultrasound signal can travel into a transmission medium, and can return as an echo signal. The transducer 14 can receive the echo signal and convert the echo signal into a low voltage receive signal, which can be provided to the switch protected amplifier 15 for amplification. The switch protected amplifier 15 can amplify the receive signal and send the amplified receive signal to the ultrasound console 12 over the cable 13.

The ultrasound console 12 includes a transmitter 21, a receiver 22, a transmit/receive (T/R) switch 23, a controller 24, and an image processor 25. The transmitter 21 is electrically connected to the cable 13, and can be used to generate high voltage transmit signals for the ultrasound probe 11. The receiver 22 can be used to sense amplified receive signals generated by the switch protected amplifier 15. In certain implementations, the receiver 22 can include a time-gain compensation (TGC) amplifier and an analog-to-digital converter for converting a receive signal into a digital signal.

In the illustrated configuration, the T/R switch 23 has been disposed in a signal path between the receiver 22 and the cable 13. The T/R switch 23 can be used to protect the receiver 22 from the high voltage transmit signals generated by the transmitter 21. For example, the receiver 22 can include high performance low voltage circuitry used to sense low voltage receive signals, and the T/R switch 23 can be turned off while the high voltage transmit signals are transmitted from the transmitter 21 to the ultrasound probe 11 so as to protect the receiver 22. However, the T/R switch 23 can be turned on when the transmitter 21 is not transmitting high voltage transmit signals, thereby allowing the receiver 22 to receive signals from the ultrasound probe 11.

The image processor 25 can be used to process signals received from the ultrasound probe 11 so as to generate image data. For example, the image processor 25 can compute image pixel data based on the receive signals sensed by the receiver 22.

The controller 24 can be used to control the operate of the transmitter 21 and the receiver 22. The controller 24 can include a microprocessor and one or more memories. In certain implementations, the controller 24 can also be used to control the operation of the T/R switch 23. However, in other implementations, the T/R switch 23 can be configured to turn on and off based on a voltage sensed at the output of the transmitter 21.

While illustrated in FIG. 1 with a single transducer for clarity, it will be understood that the ultrasound probe 11 will typically include multiple transducers, such as an array of transducers. For example, the ultrasound probe 11 can include multiple channels each associated with a transducer, a transmit circuit, and a switch protected amplifier. In certain implementations, the transmitter 21 can include beam forming circuitry used to control or shape an ultrasound signal generated by a transducer array by controlling the timing or delay of transmit signals to the array of transducers.

Figure 2:
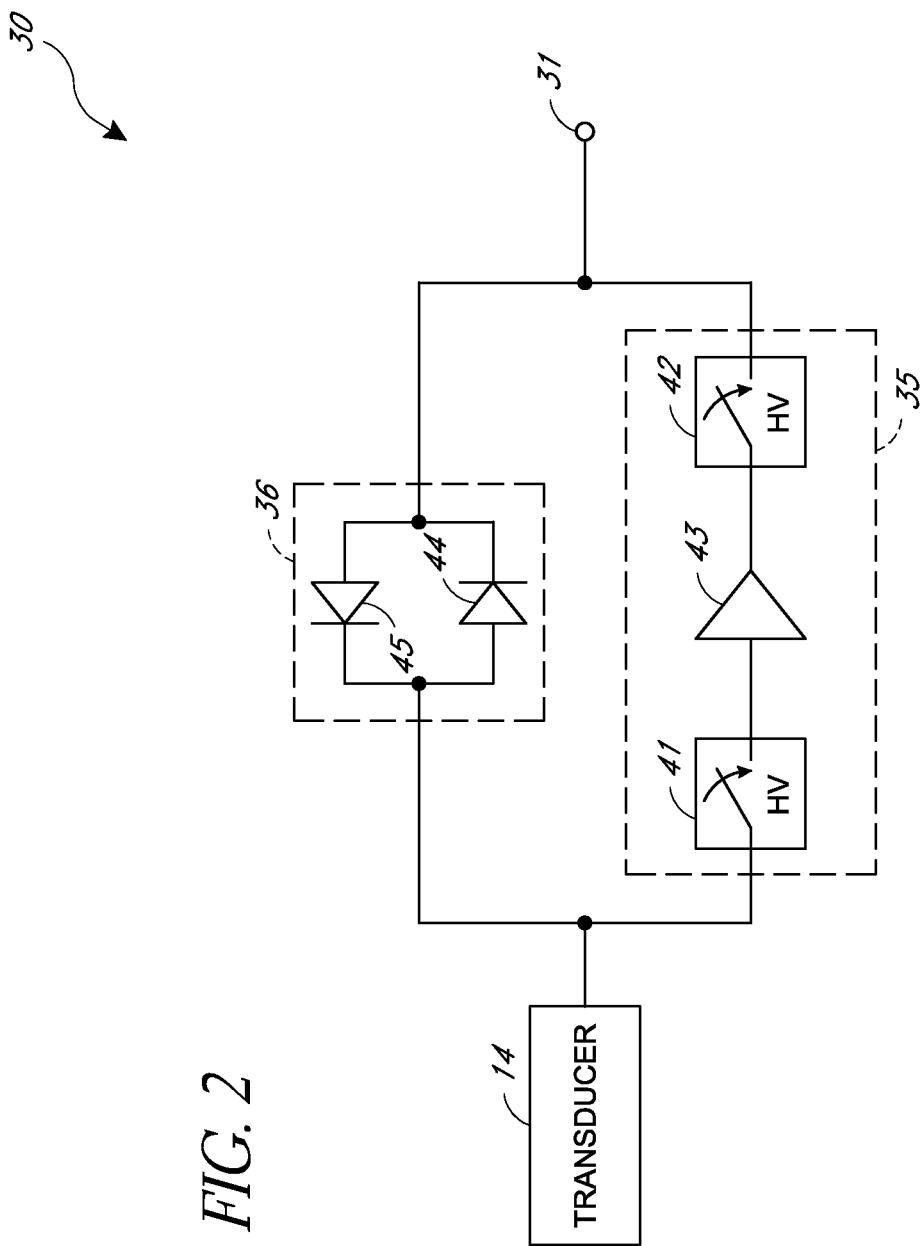
FIG. 2 is a schematic diagram of one embodiment of an ultrasound probe.

FIG. 2 is a schematic diagram of one embodiment of an ultrasound probe 30. The ultrasound probe 30 includes the transducer 14, a switch protected amplifier 35, and a transmit circuit 36. The ultrasound probe 30 further includes a cable port 31, which can be used to electrically connect the ultrasound probe 30 to an ultrasound console using a cable, such as the cable 13 of FIG. 1.

The switch protected amplifier 35 includes a first high voltage receive switch 41, a second high voltage receive switch 42, and an amplifier 43. The first high voltage receive switch 41 includes a first or high voltage terminal electrically connected to the transducer 14 and to a first terminal of the transmit circuit 36. Additionally, the first high voltage receive switch 41 further includes a second or low voltage terminal electrically connected to an input of the amplifier 43. The second high voltage receive switch 42 includes a low voltage terminal electrically connected to an output of the amplifier 43 and a high voltage terminal electrically connected to a second terminal of the transmit circuit 36 and to the cable port 31.

The transmit circuit 36 includes a first diode 44 and a second diode 45 arranged back-to-back. For example, the first diode 44 includes an anode electrically connected to a cathode of the second diode 45 and a cathode electrically connected to an anode of the second diode 45. As shown in FIG. 2, the anode of the first diode 44 and the cathode of the second diode 45 are electrically connected to the transducer 14 and to the high voltage terminal of the first high voltage receive switch 41. Additionally, the cathode of the first diode 44 and the anode of the second diode 45 are electrically connected to the cable port 31 and to the high voltage terminal of the second high voltage receive switch 42.

The first and second high voltage receive switches 41, 42 can open and close in response to voltage conditions sensed or detected on the high voltage terminals of the receive switches. For example, each high voltage receive switch can detect the voltage conditions at the switch's high voltage terminal and can turn off when the detected voltage is greater than a first or positive threshold voltage or when the detected voltage is less than a second or negative threshold voltage. Additionally, in the absence of a detected positive or negative high voltage condition, the receive switch can be configured to turn on. Thus, in the absence of high voltage conditions, the first and second high voltage receive switches 41, 42 can be turned on, thereby allowing the receive signal to reach the input of the amplifier 43 and for the amplified receive signal generated by the amplifier's output to reach the cable port 31. Configuring the first and second high voltage receive switches 41, 42 to open and close in response to sensed voltage conditions allows the high voltage receive switches to operate without needing to send control signals between an ultrasound console and the ultrasound probe 30.

The amplifier 43 can be used to amplify a receive signal generated by the transducer 14 and to generate an amplified receive signal on the cable port 31. In certain implementations, the amplifier 43 is a low noise amplifier, having a noise figure of less than or equal to about 3 dB. In certain implementations, the amplifier 43 can be fabricated at least in part using low voltage transistors.

The transmit circuit 36 can be used to pass high voltage transmit signals received on the cable port 31 to the transducer 14. For example, the transmit circuit 36 can be used to pass a positive voltage transmit signal having a voltage magnitude greater than about a forward voltage of the second diode 45 and to pass a negative voltage transmit signal having a voltage magnitude greater than about a forward voltage of the first diode 44. However, the transmit circuit 36 can be used to block or impede low voltage receive signals generated by the transducer 14 and/or the amplifier 43.

Although FIG. 2 illustrates one example of a transmit circuit that can be used with the switch protected amplifiers described herein, other implementations of transmit circuits can be used. For example, additional diodes can be arranged in series with the first and second diodes 44, 45 such that series combinations of diodes are arranged back-to-back. Additionally, other elements, such as transistors can be used alone or in combination with diodes to pass high voltage transmit signals and to block low voltage receive signals.

Figure 3:
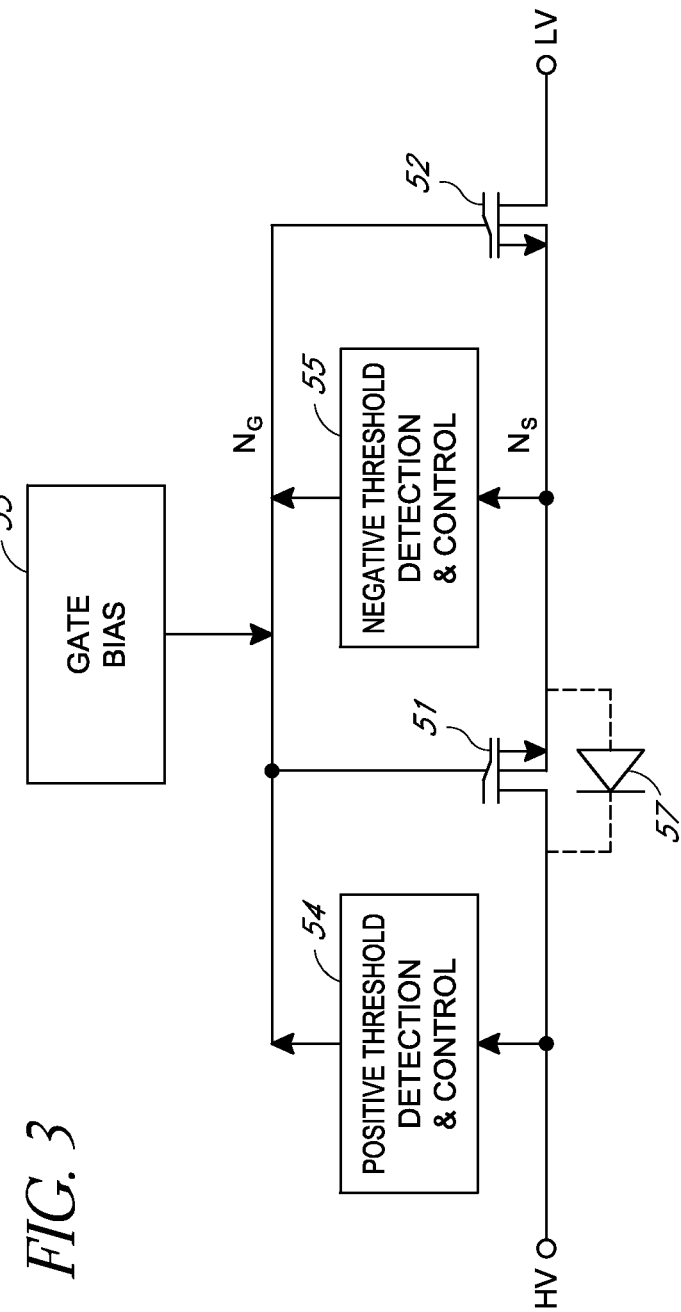
FIG. 3 is a circuit diagram of one embodiment of a high voltage receive switch.

FIG. 3 is a circuit diagram of one embodiment of a high voltage receive switch 50. The high voltage receive switch 50 includes a first n-type high voltage field effect transistor (HVFET) 51, a second n-type HVFET 52, a gate bias circuit 53, a first or positive threshold detection and control circuit 54, and a second or negative threshold detection and control circuit 55. Additionally, the high voltage receive switch 50 includes a first or high voltage terminal HV and a second or low voltage terminal LV. The high voltage receive switch 50 illustrates one embodiment of a high voltage receive switch suitable for use in the switch protected amplifiers described herein. For example, the high voltage receive switch 50 can be used to implement the first and/or second high voltage receive switches 41, 42 of FIG. 2.

The first n-type HVFET 51 includes a drain electrically connected to the high voltage terminal HV, a gate electrically connected to a gate of the second n-type HVFET 52 at a gate node $N_G$, and a body and source electrically connected to a body and source of the second n-type HVFET 52 at a source node $N_S$. The second n-type HVFET 52 further includes a drain electrically connected to the low voltage terminal LV.

The gate bias circuit 53 is configured to control a voltage of the gate node $N_G$ so as to turn on the first and second n-type HVFETs 51, 52 when the high voltage terminal HV is operating with low voltage conditions. However, when a positive high voltage condition occurs on the high voltage terminal HV, the positive threshold detection and control circuit 54 can control the voltage of the gate node $N_G$ so as to turn off at least one of the first or second n-type HVFETs 51, 52. For example, in certain implementations the positive threshold detection and control circuit 54 can control the voltage of the gate node $N_G$ to a voltage level of a ground or power low supply when the positive threshold detection and control circuit 54 determines that the voltage of the high voltage terminal HV is greater than a positive threshold voltage. Additionally, when a negative high voltage condition occurs on the high voltage terminal HV, the negative threshold detection and control circuit 55 can control the voltage of the gate node $N_G$ so as to turn off at least one of the first or second n-type HVFETs 51, 52. For example, in certain implementations the negative threshold detection and control circuit 55 can electrically connect the gate node $N_G$ to the source node $N_S$ when the voltage of the high voltage terminal HV is less than a negative threshold voltage.

When fabricating the first and second n-type HVFETs 51, 52 using certain manufacturing processes, the first and second n-type HVFETs 51, 52 can include drain-to-body parasitic diodes. For example, the first n-type HVFET 51 can include a drain-to-body parasitic diode 57 including a cathode electrically connected to the drain and an anode electrically connected to the source and body.

When the voltage of the high voltage terminal HV is less than the voltage of the source node $N_S$ by the parasitic diode's forward voltage, the voltage of the source node $N_S$ can track or change in response to the voltage of the high voltage terminal HV. To aid in turning off the high voltage receive switch 50 when a negative high voltage condition is detected on the high voltage terminal HV, the negative threshold detection and control circuit 55 can be configured to control the voltage of the gate node $N_G$ based on a voltage of the source node $N_S$ such that gate-to-source voltage of the first and second n-type HVFETs 51, 52 is less than the HVFETs' threshold voltage. For example, in one embodiment, the negative threshold detection and control circuit 55 can be configured to control the voltage of the gate node $N_G$ to be about equal to a voltage of the source node $N_S$ when a negative high voltage condition is detected so that the gate-to-source voltage of the first and second n-type HVFETs 51, 52 is about equal to 0 V.

The positive and negative threshold voltages can be selected to be any suitable value. For example, in one embodiment, the positive threshold voltage is selected to be in the range of about 0.6 V to about 0.9 V, and the negative threshold voltage is selected to be in the range of about −0.6 V to about −0.9 V. However, persons having ordinary skill in the art will readily appreciate other suitable threshold voltages, such as those depending on application or system-level constraints. The positive and negative threshold voltages can be referenced to any suitable voltage reference, such as a ground supply, a power high supply, a power low supply, or a regulated voltage.

The first and second n-type HVFETs 51, 52 can be any suitable high voltage transistors. For example, in certain implementations, the first and second n-type HVFETs 51, 52 can be configured to withstand a drain-to-source voltage of up to about 125 V. To aid in reducing power consumption and to avoid a need to use high voltage power supplies, in certain implementations the first and second n-type HVFETs 51, 52 can be configured to have a relatively low threshold voltage, such as a threshold voltage in the range of about 0.1 V to about 0.8 V. In one embodiment, the first and second n-type HVFETs 51, 52 are double-diffused metal oxide semiconductor (DMOS) transistors. However, it will be understood that the gate of a MOSFET can be made from materials other than metals, such as from polysilicon, and that materials other than silicon oxide, such as silicon nitride or high k dielectrics can be used to insulate the gate.

Figure 4:
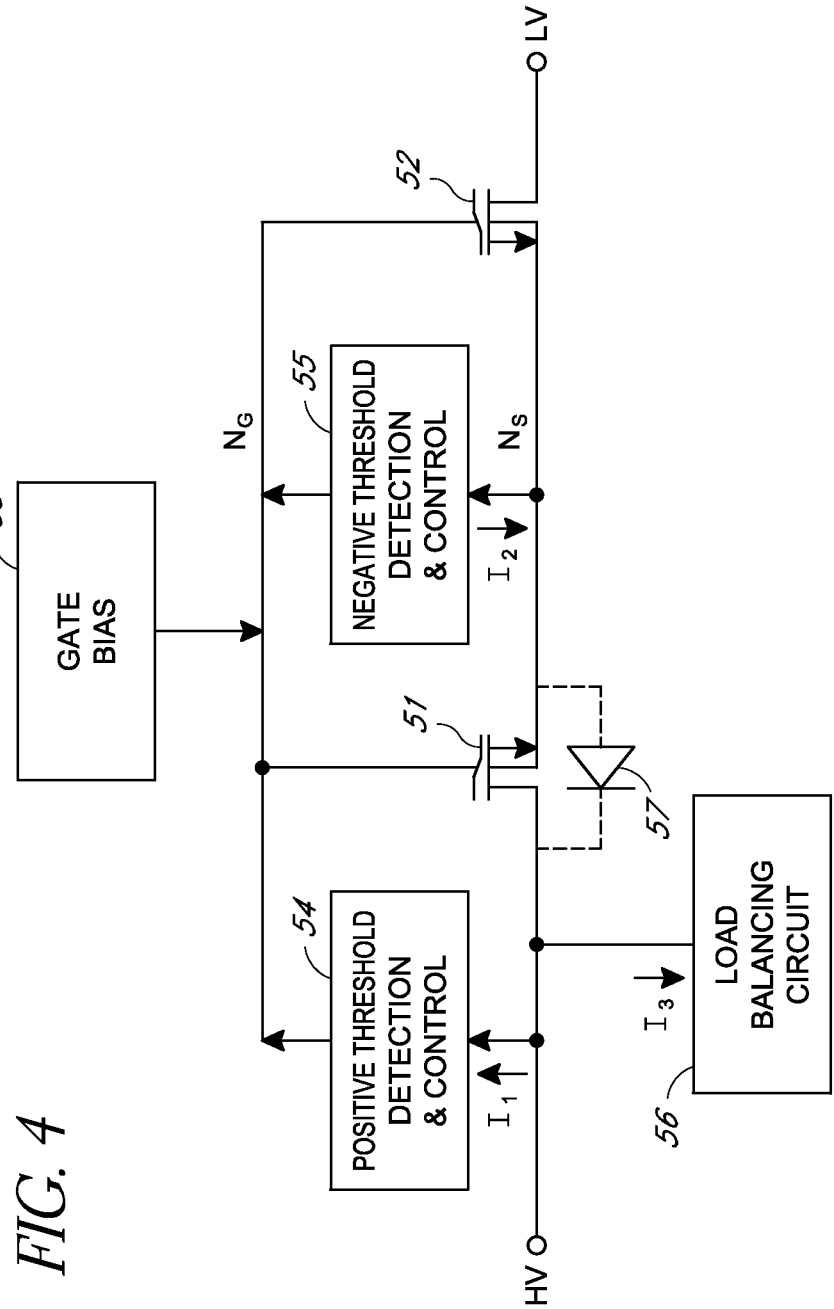
FIG. 4 is a circuit diagram of another embodiment of a high voltage receive switch.

FIG. 4 is a circuit diagram of another embodiment of a high voltage receive switch 60. The high voltage receive switch 60 includes the first and second n-type HVFETs 51, 52, the gate bias circuit 53, the positive threshold detection and control circuit 54, the negative threshold detection and control circuit 55, and a load balancing circuit 56.

The high voltage receive switch 60 of FIG. 4 is similar to the high voltage receive switch 50 of FIG. 3, except that the high voltage receive switch 60 further includes the load balancing circuit 56.

The load balancing circuit 56 can be used to balance or match the load current of a circuit driving the high voltage terminal HV when the terminal is controlled to positive and negative high voltage conditions. For example, when a positive high voltage condition is received on the high voltage terminal HV, a first current $I_1$ can flow into the positive threshold detection and control circuit 54. Additionally, when a negative high voltage condition is received on the high voltage terminal HV, a second current $I_2$ can flow from the negative threshold detection and control circuit 55 to the high voltage terminal HV through the parasitic diode 57. Absent load balancing, a difference in current magnitudes between the first and second currents $I_1$, $I_2$ can result in an ultrasound console's transmitter having asymmetric loading, which can result in transmit signal distortion.

In certain implementations, the load balancing circuit 56 can be included to aid in balancing current loading for positive and negative high voltage conditions. For example, in one embodiment, the load balancing circuit 56 is configured to generate a third current $I_3$ having a current magnitude selected such that the sum of the first current $I_1$ and the third current $I_3$ is within about 200 µA of the second current $I_2$.

Figure 5:
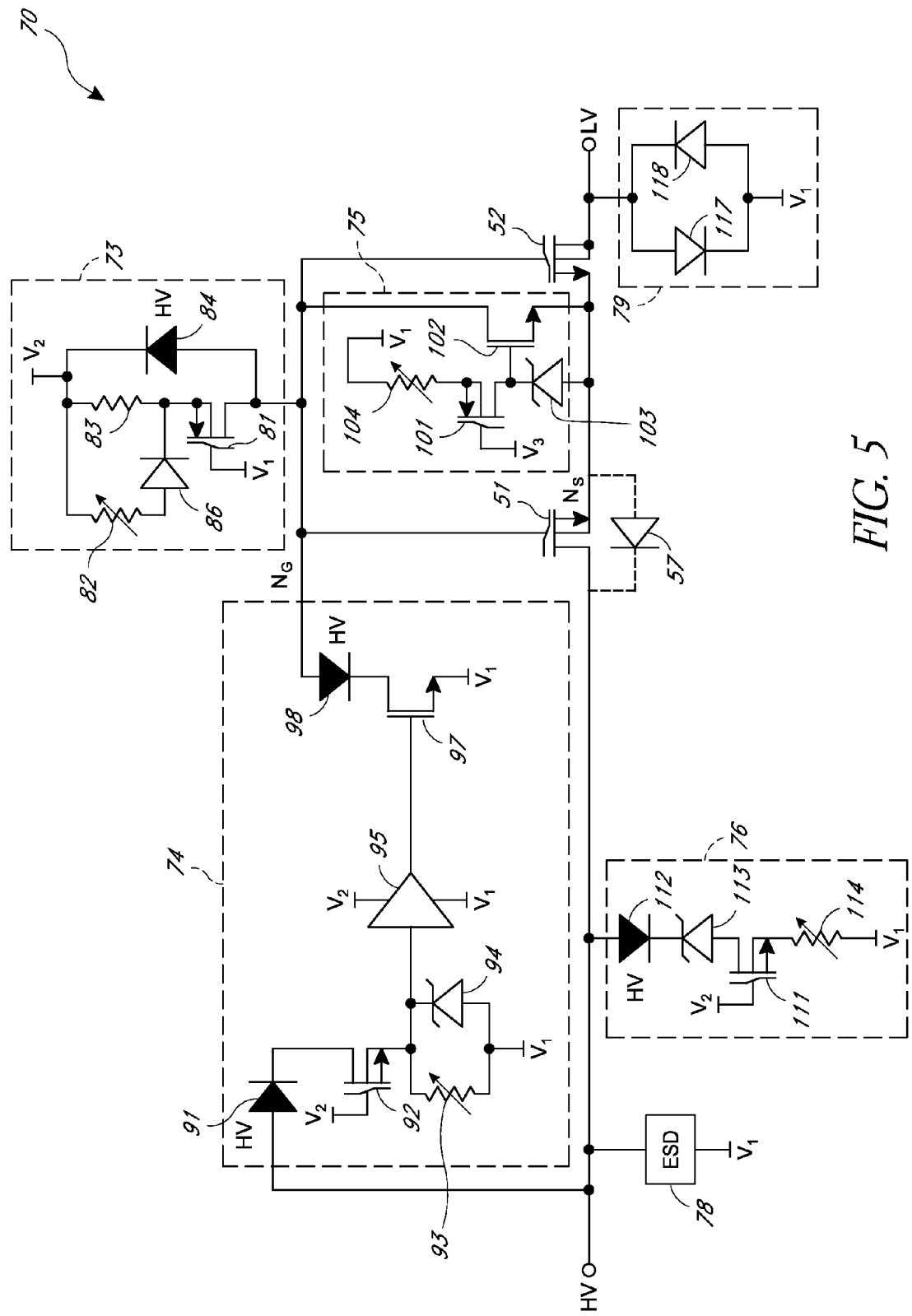
FIG. 5 is a circuit diagram of another embodiment of a high voltage receive switch.

FIG. 5 is a circuit diagram of another embodiment of a high voltage receive switch 70. The high voltage receive switch 70 includes the first and second n-type HVFETs 51, 52, a gate bias circuit 73, a positive threshold detection and control circuit 74, a negative threshold detection and control circuit 75, a load balancing circuit 76, an electrostatic discharge (ESD) protection circuit 78, and an amplifier protection circuit 79.

The gate bias circuit 73 includes a p-type HVFET 81, a programmable resistor 82, a resistor 83, a high voltage diode 84, and a diode 86. The p-type HVFET 81 includes a drain electrically connected to the gate node $N_G$, a gate electrically connected to a first voltage supply $V_1$, and a drain and body electrically connected to a cathode of the diode 86 and to a first end of the resistor 83. The diode 86 further includes an anode electrically connected to a first end of the programmable resistor 82. The programmable resistor 82 and the resistor 83 each further include a second end electrically connected to a second voltage supply $V_2$, which can have a voltage level that is greater than that of the first voltage supply $V_1$. For example, in certain implementations the first voltage supply $V_1$ is a ground supply and the second voltage supply $V_2$ is a power high supply. The high voltage diode 84 includes an anode electrically connected to the gate node $N_G$ and a cathode electrically connected to the second voltage supply $V_2$.

The gate bias circuit 73 can be used to bias the gate node $N_G$ so as to turn on the first and second HVFETs 51, 52 when no high voltage conditions are detected on the high voltage terminal HV. For example, the p-type HVFET 81 can be used to control the voltage of the gate node $N_G$ to be about equal to the voltage of the second voltage supply $V_2$ when the positive threshold detection and control circuit 74 and the negative threshold detection and control circuit 75 are inactive. However, a drive strength of the gate bias circuit 73 can be weaker or less than a drive strength of the positive threshold detection and control circuit 74 such that the positive threshold detection and control circuit 74 can control the voltage of the gate node $N_G$ when a positive high voltage condition is detected on the high voltage terminal HV. Similarly, the drive strength of the gate bias circuit 73 can be weaker than a drive strength of the negative threshold detection and control circuit 75 such that the negative threshold detection and control circuit 75 can control the voltage of the gate node $N_G$ when a negative high voltage condition is detected on the high voltage terminal HV.

The high voltage diode 84 can be used to protect the first and second n-type HVFETs 51, 52, the positive threshold detection and control circuit 74, and the negative threshold detection and control circuit 75 from damage by limiting a maximum voltage of the gate node $N_G$. For example, the high voltage diode 84 can be used to clamp or limit a maximum voltage of the gate node $N_G$ to be about equal to the voltage of the second voltage supply $V_2$ plus a forward voltage of the high voltage diode 84. Although the illustrated gate bias circuit 73 uses the high voltage diode 84 to protect the gates of the first and second n-type HVFETs 51, 52, other configurations are possible, such as implementations using one or more additional diodes in series with the high voltage diode 84 or implementations using another arrangement of components.

As will be described further below, the voltage of the gate node $N_G$ can be pulled to a relatively low voltage when a positive or negative high voltage condition is detected on the high voltage terminal HV. After the high voltage condition is no longer detected, the gate bias circuit 73 can be used to recover or pull-up the voltage of the gate node $N_G$ to be about equal to the voltage of the second voltage supply $V_2$ so as to turn back on the first and second n-type HVFETs 51, 52.

Configuring the pull-up resistance of the gate bias circuit 73 to be relatively small can decrease a recovery delay or time of the gate bias circuit 73. However, configuring the pull-up resistance of the gate bias circuit 73 to be relatively small can also degrade on-state performance of the high voltage receive switch 70 by increasing the switch's noise. In certain implementations, the gate bias circuit 73 includes a resistive circuit that is configured to pull-up the gate node $N_G$ when a voltage difference between the second voltage supply $V_2$ and the gate node $N_G$ is greater than a threshold voltage and to shut-off or block current when the voltage difference is less than the threshold voltage. For example, the illustrated gate bias circuit 73 includes the programmable resistor 82 arranged in series with the diode 86. When a voltage difference between the second voltage supply $V_2$ and the gate node $N_G$ is greater than the forward voltage of the diode 86, the programmable resistor 82 can aid the resistor 83 in recovering or pulling-up the voltage of gate node $N_G$ to the voltage of the second voltage supply $V_2$. However, when the difference in voltage between the second voltage supply $V_2$ and the gate node $N_G$ is less than the forward voltage of the diode 86, the diode 86 can block the flow of current through the programmable resistor 82, thereby helping to prevent the programmable resistor's thermal noise from impacting the on-state performance of the high voltage receive switch 70. In certain implementations, the programmable resistor 82 is configured to have a resistance that is less than the resistance of the resistor 83, such as a resistance that is programmable to at least 10 times less than the resistance of the resistor 83.

The positive threshold detection and control circuit 74 includes a first high voltage diode 91, an n-type HVFET 92, a programmable resistor 93, a Zener diode 94, a comparator 95, an n-type FET (NFET) 97, and a second high voltage diode 98. The first high voltage diode 91 includes an anode electrically connected to the high voltage terminal HV and a cathode electrically connected to a drain of the n-type HVFET 92. The n-type HVFET 92 further includes a gate electrically connected to the second voltage supply $V_2$. The n-type HVFET 92 further includes a source and body electrically connected to an input of the comparator 95, to a first end of the programmable resistor 93, and to a cathode of the Zener diode 94. The programmable resistor 93 further includes a second end electrically connected to the first voltage supply $V_1$, and the Zener diode 94 further includes an anode electrically connected to the first voltage supply $V_1$. The comparator 95 is powered using the first and second voltage supplies $V_1$, $V_2$, and includes an output electrically connected to the gate of the NFET 97. The NFET 97 further includes a source electrically connected to the first voltage supply $V_1$ and a drain electrically connected to a cathode of the second high voltage diode 98. The second high voltage diode 98 further includes an anode electrically connected to the gate node $N_G$.

The positive threshold detection and control circuit 74 can be used to turn off the first and second n-type HVFETs 51, 52 when a positive high voltage condition is detected on the high voltage terminal HV. For example, the series combination of the first high voltage diode 91 and the n-type HVFET 92 can turn-on at a positive threshold voltage that is about equal to the forward voltage of the first high voltage diode 91, thereby providing a flow of current through the programmable resistor 93. The flow of current can generate a corresponding voltage across the programmable resistor 93 that can be detected by the comparator 95. In response to the detected voltage, the comparator 95 can turn-on the NFET 97, thereby providing a low impedance path between the gate node $N_G$ and the first voltage supply $V_1$ so as to turn-off the first and second n-type HVFETs 51, 52.

The first and second high voltage diodes 91, 98 and the Zener diode 94 can aid in protecting the positive threshold detection and control circuit 74 from damage during high voltage conditions. For example, when a negative high voltage condition is received on the high voltage terminal HV, the first high voltage diode 91 can protect the comparator 95 from damage by preventing the negative high voltage condition from reaching the comparator's input. Additionally, the second high voltage diode 98 can protect the NFET 97 from damage when the voltage of the gate node $N_G$ falls below the voltage of the first voltage supply $V_1$. Furthermore, the Zener diode 94 can protect the comparator 95 from damage associated with any transient high voltage signals that reach the comparator's input via AC coupling. For example, high voltage signals can couple through a drain-to-source parasitic capacitance of the n-type HVFET 92, and the Zener diode 94 can protect the comparator 95 from high voltage conditions by clamping or limiting the maximum voltage at the input of the comparator to about the diode's Zener voltage.

The negative threshold detection and control circuit 75 includes a p-type HVFET 101, an NFET 102, a Zener diode 103, and a programmable resistor 104. The Zener diode 103 includes an anode electrically connected to the source node $N_S$ and a cathode electrically connected to a drain of the p-type HVFET 101 and to a gate of the NFET 102. The p-type HVFET 101 further includes a gate electrically connected to a third voltage supply $V_3$, which can have a voltage level that is less than the voltage levels of the first and second voltage supplies $V_1$, $V_2$. For example, in one embodiment, the first voltage supply $V_1$ is a ground supply, the second voltage supply $V_2$ is a power high supply, and the third voltage supply $V_3$ is a power low supply. The p-type HVFET 101 further includes a source and body electrically connected to a first end of the programmable resistor 104. The programmable resistor 104 further includes a second end electrically connected to the first voltage supply $V_1$. The NFET 102 further includes a source electrically connected to the source node $N_S$ and a drain electrically connected to the gate node $N_G$.

The negative threshold detection and control circuit 75 can be used to turn off the second n-type HVFET 52 when a negative high voltage condition is detected on the high voltage terminal HV. For example, the p-type HVFET 101 and the programmable resistor 104 can be used to provide a relatively weak or high resistance path between the gate of the NFET 102 and the first voltage supply $V_1$. Accordingly, the NFET 102 can have a steady-state gate bias voltage that is about equal to the voltage of the first voltage supply $V_1$. When, a negative high voltage condition is received on the high voltage terminal HV, the drain-to-body parasitic diode 57 of the first n-type HVFET 51 can become forward-biased and the voltage of the source node $N_S$ can have a voltage that is greater than the voltage of the high voltage terminal HV by about the parasitic diode's forward voltage. Additionally, when the voltage of the source node $N_S$ decreases below the voltage of the first voltage supply $V_1$ by about the threshold voltage of the NFET 102, the NFET 102 can turn-on and provide a low impedance path between the gate node $N_G$ and the source node $N_S$, thereby electrically connecting the gate node $N_G$ and source node $N_S$ to one another and turning off the second n-type HVFET 52. Furthermore, when the voltage of the source node $N_S$ decreases below the Zener voltage of the Zener diode 103, the Zener diode 103 can activate and control the voltage of the gate of the NFET 102 to be about a Zener voltage above the voltage of the source node $N_S$. Accordingly, the gate voltage of the NFET 102 can track or change in response to the voltage of the source node $N_S$ when a negative high voltage condition is received on the high voltage terminal HV.

The load balancing circuit 76 includes an n-type HVFET 111, a high voltage diode 112, a Zener diode 113, and a programmable resistor 114. The high voltage diode 112 includes an anode electrically connected to the high voltage terminal HV and a cathode electrically connected to a cathode of the Zener diode 113. The Zener diode 113 further includes an anode electrically connected to a drain of the n-type HVFET 111. The n-type HVFET 111 further includes a gate electrically connected to the second voltage supply $V_2$ and a source and body electrically connected to a first end of the programmable resistor 114. The programmable resistor 114 further includes a second end electrically connected to the first voltage supply $V_1$.

The load balancing circuit 76 can be used to balance or match a flow of current into or out of the high voltage terminal HV for positive and negative high voltage conditions, thereby helping to match the receive switch's current loading on an ultrasound transmitter driving the high voltage terminal HV. For example, when a positive high voltage condition is received on the high voltage terminal HV, a first current can flow into the high voltage diode 91 of the positive threshold detection and control circuit 74. Additionally, when a negative high voltage condition is received on the high voltage terminal HV, a second current can flow from the negative threshold detection and control circuit 75 to the high voltage terminal HV through the parasitic diode 57, and can be associated with a first current component through the Zener diode 103 and a second current component through the NFET 102. In a manner similar to that described earlier with respect to FIG. 4, the load balancing circuit 76 can be used to balance the first and second currents so as to provide symmetric loading to an ultrasound console's transmitter driving the high voltage terminal HV.

The illustrated high voltage receive switch 70 includes various programmable resistors, such as the programmable resistor 82 of the gate bias circuit 73, the programmable resistor 93 of the positive threshold detection and control circuit 74, the programmable resistor 104 of the negative threshold detection and control circuit 75, and the programmable resistor 114 of the load balancing circuit 76. The programmable resistors can have a resistance that is configurable or otherwise programmable by an end-user. For example, in one embodiment the programmable resistors can each include a plurality of resistive elements or segments that can be individually selected to provide a discrete resistance of a desired value. In one embodiment, the programmable resistors are implemented using an array of field-effect transistors biased in a linear or triode mode of operation to achieve a target resistance. However, other configurations are possible, such as configurations in which the resistors are implemented using passive circuit components, such as polysilicon resistors. Configuring the resistors to be programmable can aid in adapting the high voltage receive switch 70 for use in multiple applications. For example, the programmable resistors can be set to resistance values suitable for a particular ultrasound probe, such as a cardiovascular ultrasound probe, a prenatal ultrasound probe, or a skin ultrasound probe.

The programmable resistors can be used to tune, for example, the pull-up strength of the gate bias circuit 73, the recovery time of the positive threshold detection and control circuit 74, the recovery time of the negative threshold detection and control circuit 75, and/or the magnitude of the current generated by the load balancing circuit 76. Although programmable resistors can be used in certain configurations, in other implementations the programmable resistors can be omitted in favor of using, for example, resistors of fixed value.

The amplifier protection circuit 79 includes a first diode 117 and a second diode 118 arranged back-to-back between the low voltage terminal LV and the first voltage supply $V_1$. For example, the first diode 117 includes an anode electrically connected to the low voltage terminal LV and a cathode electrically connected to the first voltage supply $V_1$, and the second diode 118 includes an anode electrically connected to the first voltage supply $V_1$ and a cathode electrically connected to the low voltage terminal LV. The amplifier protection circuit 79 can be used to protect an amplifier coupled to the low voltage terminal LV by clamping or limiting a voltage of the low voltage terminal LV to be within about a forward voltage of the first and second diodes 117, 118, thereby protecting the amplifier from any high voltage signals that reach the low voltage terminal LV by way of, for example, AC coupling. Although one configuration of the amplifier protection circuit 79 has been illustrated, other configurations can be used, including, for example, configurations using addition diodes in series with the first and/or second diodes 117, 118.

The ESD protection circuit 78 can be used to protect the high voltage receive switch 70 from electrostatic discharge events (ESD) associated with the abrupt release of charge from an object or person to an electronic system. For example, to help guarantee that an electronic system such as an ultrasound system is reliable, manufacturers can test the system under defined stress conditions, which can be described by standards set by various organizations, such as the Joint Electronic Device Engineering Council (JEDEC) and the International Electrotechnical Commission (IEC). The standards can cover a wide multitude of ESD events, such as an ESD event defined by the JEDEC JS-001 Human Body Model (HBM). In certain implementations, the ESD protection circuit 78 can be used to provide protection against ESD events having a voltage in the range of about 2,000 V to 8,000 V. Accordingly, in contrast to high voltage transmit signals sensed by the positive threshold detection and control circuit 74 and the negative threshold detection and control circuit 75 during normal high voltage operation of the receive switch 70, ESD events can be associated with overvoltage conditions that can damage even the high voltage devices of the high voltage receive switch 70 by way of, for example, gate oxide punch-through, junction damage, and/or metal damage.

Although FIG. 5 illustrates one example of a high voltage receive switch in accordance with the teachings herein, persons having ordinary skill in the art will appreciate that high voltage receive switches can be implemented in other ways. For example, other configurations of a gate bias circuit, a positive threshold detection and control circuit, and/or a negative threshold detection and control circuit can be used. Furthermore, in certain configurations, one or more of the illustrated components can be omitted, combined with other components, or arranged in other ways. For example, in certain implementations, the load balancing circuit 76, the ESD protection circuit 78, and/or the amplifier protection circuit 79 can be omitted.

Figure 6:
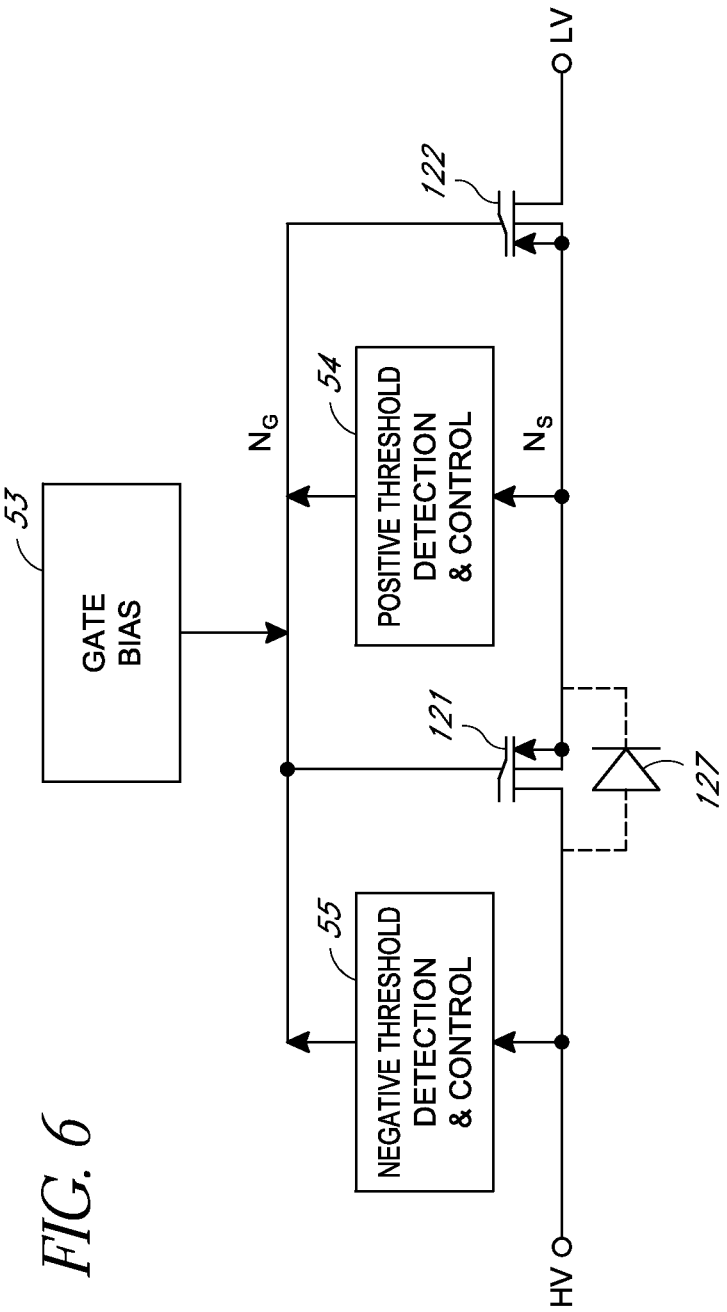
FIG. 6 is a circuit diagram of another embodiment of a high voltage receive switch.

FIG. 6 is a circuit diagram of another embodiment of a high voltage receive switch 120. The high voltage receive switch 120 includes a first p-type HVFET 121, a second p-type HVFET 122, the gate bias circuit 53, the positive threshold detection and control circuit 54, and the negative threshold detection and control circuit 55.

The first p-type HVFET 121 includes a drain electrically connected to the high voltage terminal HV, a gate electrically connected to a gate of the second p-type HVFET 122 at a gate node $N_G$, and a body and source electrically connected to a body and source of the second p-type HVFET 122 at a source node $N_S$. The second p-type HVFET 122 further includes a drain electrically connected to the low voltage terminal LV.

The gate bias circuit 53 is configured to control a voltage of the node $N_G$ so as to turn on the first and second p-type HVFETs 121, 122 when the high voltage terminal HV is operating with low voltage conditions. The negative threshold detection and control circuit 55 is electrically connected to the high voltage terminal HV, and is configured to turn off at least one of the first and second p-type HVFETs 121, 122 when a negative high voltage condition is detected on the high voltage terminal HV. Additionally, the positive threshold detection and control circuit 54 is electrically connected to the source node $N_S$, and is configured to turn off at least one of the first and second p-type HVFETs 121, 122 when a positive high voltage condition is detected on the high voltage terminal HV.

The high voltage receive switch 120 of FIG. 6 is similar to the high voltage receive switch 50 of FIG. 3, except that the high voltage receive switch 120 illustrates an implementation using the p-type HVFETs 121, 122 rather than the n-type HVFETs 51, 52. Although p-type HVFETs can have a higher channel resistance relative to n-type HVFETs, certain implementations of high voltage receive switches can use p-type HVFETs in all or part as switching components.

When using p-type HVFETs, the p-type HVFETs can have drain-to-body parasitic diodes of opposite polarity relative to a configuration using n-type HVFETs. For example, the first p-type HVFET 121 can include a drain-to-body parasitic diode 127 including an anode electrically connected to the drain and a cathode electrically connected to the source and body. The drain-to-body parasitic diode 127 can provide a current path between the high voltage terminal HV and the source node $N_S$ when a positive high voltage condition is received on the high voltage terminal HV. Accordingly, during a positive high voltage condition, the source node $N_S$ can have a voltage level that is less than the voltage of the high voltage terminal HV by about the parasitic diode's forward voltage.

To aid in turning off the p-type HVFETs 121, 122 during a positive high voltage condition, the illustrated positive threshold detection and control circuit 54 can electrically connect the gate node $N_G$ and the source node $N_S$ to one another during a positive high voltage condition such that the gate-to-source voltage of the first and second p-type HVFETs 121, 122 is less than the threshold voltage of the HVFETs. Configuring the positive threshold detection and control circuit 54 in this manner can aid in turning off the second p-type HVFET 122 even when the drain-to-body parasitic diode 127 of the first p-type HVFET 121 is forward biased. The negative threshold detection and control circuit 55 can control the voltage of the gate node $N_G$ to turn-off the first and second p-type HVFETs 121, 122 during a negative high voltage condition, such as by controlling the voltage of the gate node $N_G$ to a voltage level of a power high supply. Additional details of the high voltage receive switch 120 can be similar to those described earlier.

Overview of Ultrasound Probes Including Transmit Switches

Sharing a channel and a transducer between a transmitter and a receiver can reduce the cost of an ultrasound system by decreasing the cost of transmit and receive circuitry and the cost of cables used to connect an ultrasound console to an ultrasound probe. To reduce the ultrasound system's costs even further, the ultrasound system can be configured to share a cable between several transducers. For example, each of the transducers can include a transmit switch that can be selectively enabled to connect the cable to a particular transducer, thereby allowing the ultrasound system's transmitter or receiver to selectively communicate with a particular transducer. Although a transducer multiplexing scheme can reduce cable cost, the transmit switches used to multiplex the transducers should realize switching with a relatively small impact on the probe's power, size, and signal distortion.

In certain implementations, an ultrasound probe includes a plurality of transducers and a plurality of high voltage transmit switches that can be selectively activated to connect a particular transducer to a cable used to connect the ultrasound probe to an ultrasound console. The high voltage transmit switches can each include a bias polarity control circuit, a bias circuit, a first high voltage field effect transistor (HVFET), and a second HVFET. The first and second HVFETs can be electrically connected in series between an input terminal and an output terminal. For example, the sources of the first and second HVFETs can be connected to one another at a source node, the gates of the first and second HVFETs can be connected to one another at a gate node, and the drain of the first HVFET can be connected to the input terminal and the drain of the second HVFET can be connected to the output terminal. The bias circuit can be electrically connected between the source node and the gate node. Additionally, the bias polarity control circuit can be electrically connected between the source node and the gate node, and can turn on or off the HVFETs by controlling a polarity of a bias voltage across the bias circuit, such as by controlling a direction of current flow through the bias circuit. For example, when the high voltage transmit switch receives a signal indicating that the switch should be enabled, the bias polarity control circuit can control the polarity of the bias voltage such that a gate-to-source voltage is greater than the threshold voltage of the HVFETs. However, when the high voltage transmit switch receives a signal indicating that the switch should be disabled, the bias polarity control circuit can reverse the polarity of the bias voltage such that the gate-to-source voltage is less that the threshold voltage of the HVFETs. In certain implementations, the voltage across the bias circuit can be configured to remain substantially constant even when the voltage of the source node moves up or down in response to voltage changes of the input terminal.

Figure 7:
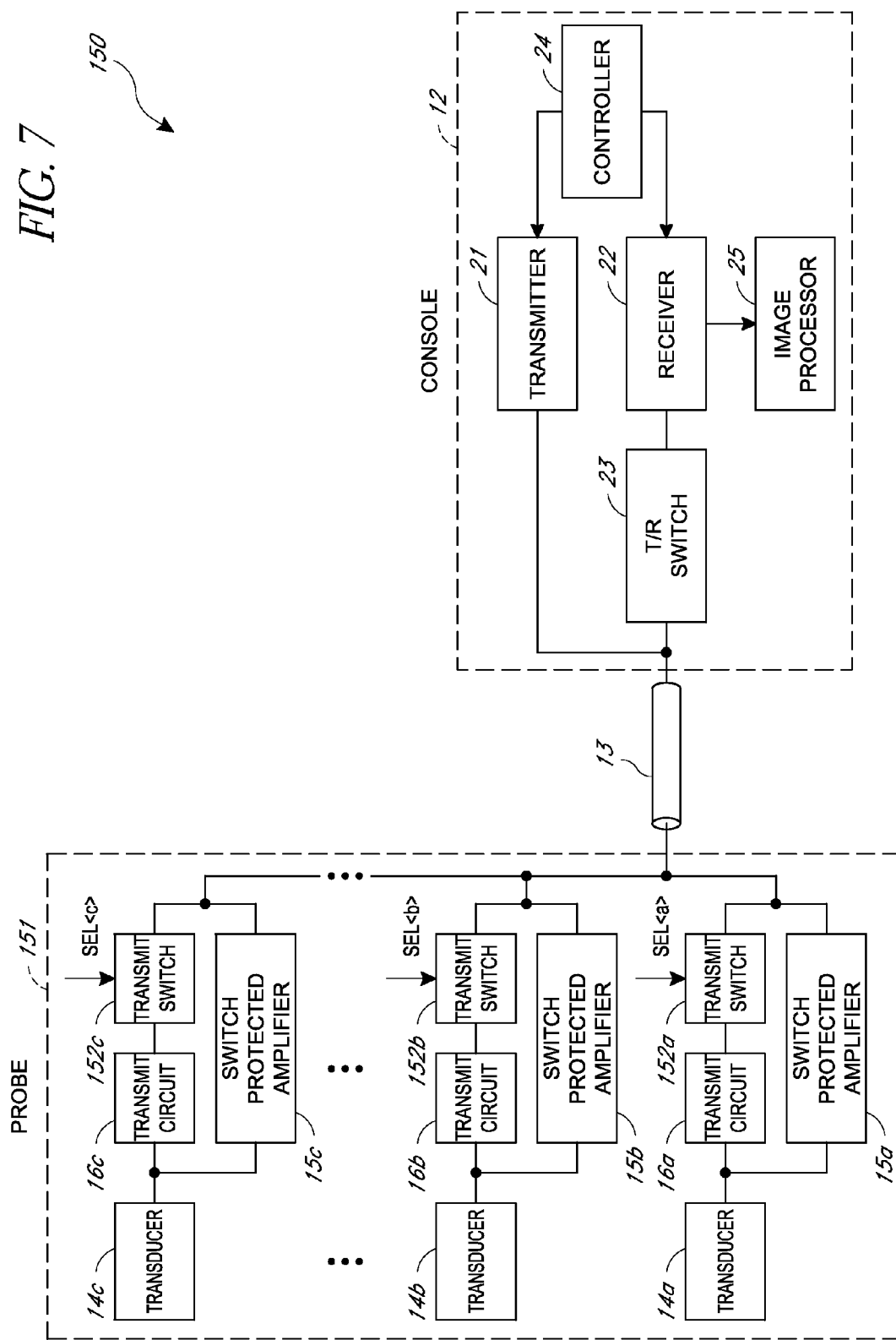
FIG. 7 is a schematic block diagram of another embodiment of an ultrasound system.

FIG. 7 is a schematic block diagram of another embodiment of an ultrasound system 150. The ultrasound system 150 includes an ultrasound probe 151, the ultrasound console 12, and the cable 13. Additional details of the ultrasound console 12 and the cable 13 can be as described earlier.

The ultrasound probe 151 includes first to third transducers 14a-14c, first to third switch protected amplifiers 15a-15c, first to third transmit circuits 16a-16c, and first to third high voltage transmit switches 152a-152c, which collectively operate as first to third channels, respectively. Although the ultrasound probe 151 illustrates a configuration using three channels, the ultrasound probe 151 can be adapted to include more or fewer channels.

The first switch protected amplifier 15a is electrically connected between the first transducer 14a and the cable 13, and the first transmit circuit 16a and the first high voltage transmit switch 152a are electrically connected in series between the first transducer 14a and the cable 13. Additionally, the second switch protected amplifier 15b is electrically connected between the second transducer 14b and the cable 13, and the second transmit circuit 16b and the second high voltage transmit switch 152b are electrically connected in series between the second transducer 14b and the cable 13. Furthermore, the third switch protected amplifier 15c is electrically connected between the third transducer 14c and the cable 13, and the third transit circuit 16c and the third high voltage transmit switch 152c are electrically connected in series between the third transducer 14c and the cable 13. Additional details of the first to third transducers 14a-14c, the first to third switch protected amplifiers 15a-15c, and the first to third transmit circuits 16a-16c can be similar to those described earlier.

The first to third transmit switches 152a-152c can be used to selectively connect the transmitter 21 of the ultrasound console 12 to a particular transducer of the ultrasound probe 151. For example, the first high voltage transmit switch 152a is configured to receive a first select signal SEL<a>, which can be activated to electrically connect the transmitter 21 to the first transducer 14a through the first transmit circuit 16a. Similarly, the second high voltage transmit switch 152b is configured to receive a second select signal SEL<b>, which can be activated to electrically connect the transmitter 21 to the second transducer 14b through the second transmit circuit 16b. Furthermore, the third high voltage transmit switch 152c is configured to receive a third select signal SEL<c>, which can be activated to electrically connected the transmitter 21 to the third transducer 14c. Although not illustrated in FIG. 7 for clarity, in certain implementations the first select signal SEL<a>, the second select signal SEL<b>, and the third select signal SEL<c> can be used to selectively enable amplifiers associated with the first to third switch protected amplifiers 15a-15c, respectively. Additionally, although FIG. 7 illustrates the ultrasound probe 151 as including first to third transmit circuits 16a-16c, in certain implementations the transmit circuits can be omitted, or the order of the transmit circuits and the high voltage transmit switches can be reversed.

The illustrated ultrasound system 150 has been configured to multiplex or share several transducers over a cable. For example, the first to third transducers 14a-14c are multiplexed to the cable 13 using the first to third high voltage transmit switches 152a-152c. Using high voltage transmit switches to multiplex transducers to a cable can reduce the ultrasound system's cable cost. Various embodiments of high voltage transmit switches will be described below with reference to FIGS. 8A-9B. The high voltage transmit switches can have low power, a relatively small size, and have a minimal impact on transmit signal quality.

Figure 8A:
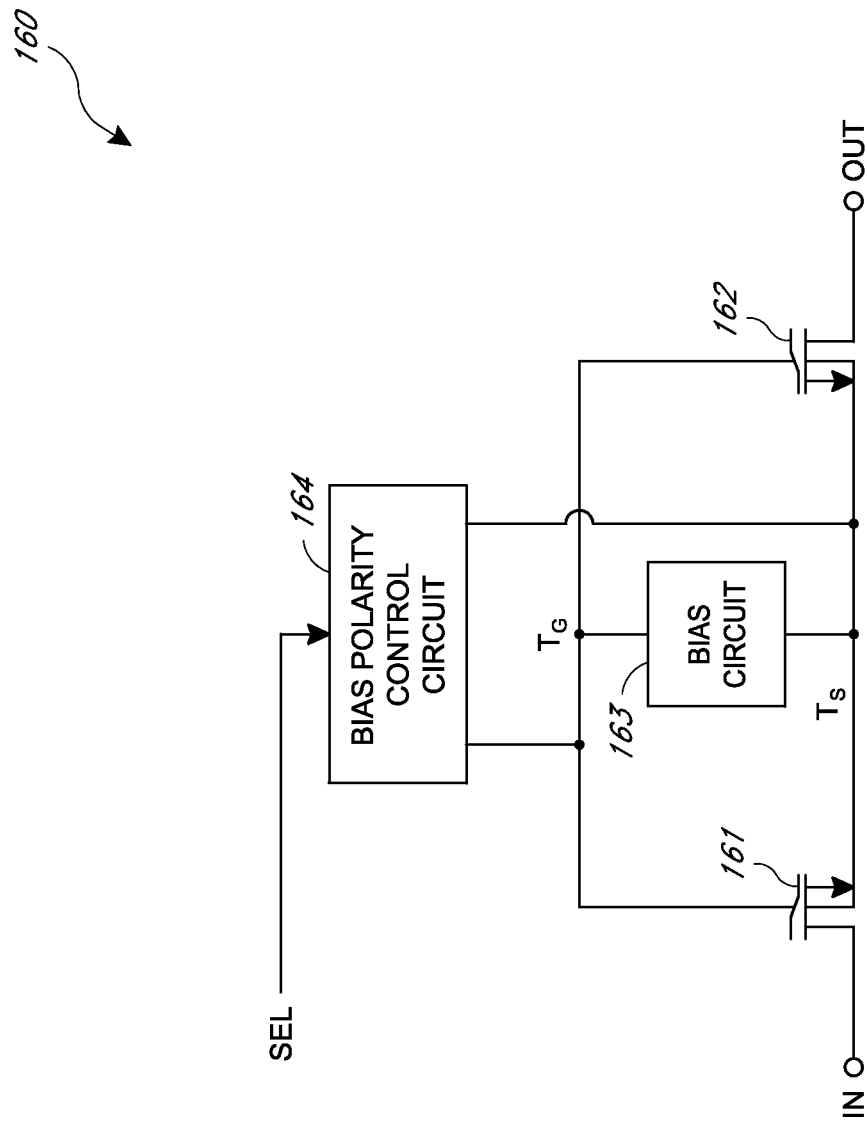
FIG. 8A is a circuit diagram of one embodiment of a high voltage transmit switch.

FIG. 8A is a circuit diagram of one embodiment of a high voltage transmit switch 160. The high voltage transmit switch 160 includes a first n-type HVFET 161, a second n-type HVFET 162, a bias circuit 163, and a bias polarity control circuit 164. Additionally, the high voltage transmit switch 160 is electrically connected between a first or input terminal IN and a second or output terminal OUT, and is configured to receive a select signal SEL. The high voltage transmit switch 160 illustrates one embodiment of a high voltage transmit switch suitable for use in the ultrasound probes described herein. For example, the high voltage transmit switch 160 can be used to implement the first to third high voltage transmit switches 152a-152c of FIG. 7.

The first n-type HVFET 161 includes a drain electrically connected to the input terminal IN, a gate electrically connected to a gate of the second n-type HVFET 162 at a gate node $T_G$, and a body and source electrically connected to a body and source of the second n-type HVFET 162 at a source node $T_S$. The second n-type HVFET 162 further includes a drain electrically connected to the output terminal OUT. The bias circuit 163 includes a first terminal electrically connected to the gate node $T_G$ and a second terminal electrically connected to the source node $T_S$. Additionally, the bias polarity control circuit 164 includes a first terminal electrically connected to the gate node $T_G$, a second terminal electrically connected to the source node $T_S$, and a control terminal configured to receive the select signal SEL.

The bias polarity control circuit 164 can be used to control a polarity of a voltage bias across the bias circuit 163 so as to turn the transmit switch 160 on or off in response to the select signal SEL. For example, when the select signal SEL indicates that the high voltage transmit switch 160 should be enabled, the bias polarity control circuit 164 can control the polarity of the bias voltage across the bias circuit 163 such that a voltage difference between the gate node $T_G$ and the source node $T_S$ is greater than the threshold voltage of the first and second n-type HVFETs 161, 162. However, when the select signal SEL indicates that the high voltage transmit switch 160 should be disabled, the bias polarity control circuit 164 can reverse the polarity of the bias voltage across the bias circuit 163 such that the gate-to-source voltage of the first and second n-type HVFETs 161, 162 is less than the HVFETs' threshold voltage. In certain implementations, the polarity of the bias voltage across the bias circuit 163 is controlled by controlling a direction of a flow of current through the bias circuit 163.

In certain implementations, the bias voltage across the bias circuit 163 can remain substantially constant even when the voltage of the source node $T_S$ moves up or down in response to changing voltage conditions on the input terminal IN. For example, when the bias polarity control circuit 164 controls the bias circuit 163 so as to turn on the high voltage transmit switch 160, the voltage of the source node $T_S$ and the voltage of the gate node $T_G$ can change with the voltage of the input terminal IN so as to maintain the first and second n-type HVFETs 161, 162 turned on. Additionally, when the bias polarity control circuit 164 controls the bias circuit 163 so as to turn off the high voltage transmit switch 160, the bias voltage across the bias circuit 163 can be maintained with changes in the voltage of the source node $N_S$ such that gate-to-source voltage of the first and second n-type HVFETs 161, 162 is less than the HVFETs' threshold voltage.

In one embodiment, the bias polarity control circuit 164 is configured to control the bias circuit 163 such that a voltage difference between the gate node $T_G$ and the source node $T_S$ is between about +3 V and about +5 V when the select signal SEL indicates that the high voltage transmit switch 160 should be enabled. Additionally, the bias polarity control circuit 164 is configured to control the bias circuit 163 such that the voltage difference between the gate node $T_G$ and the source node $T_S$ is between about −3 V and about −5 V when the select signal SEL indicates that the high voltage transmit switch 160 should be disabled. Although one example of bias voltage values has been described, persons having ordinary skill in the art will readily appreciate other suitable bias voltage values, such as bias voltages depending on a transistor fabrication process or system-level design constraints.

Figure 8B:
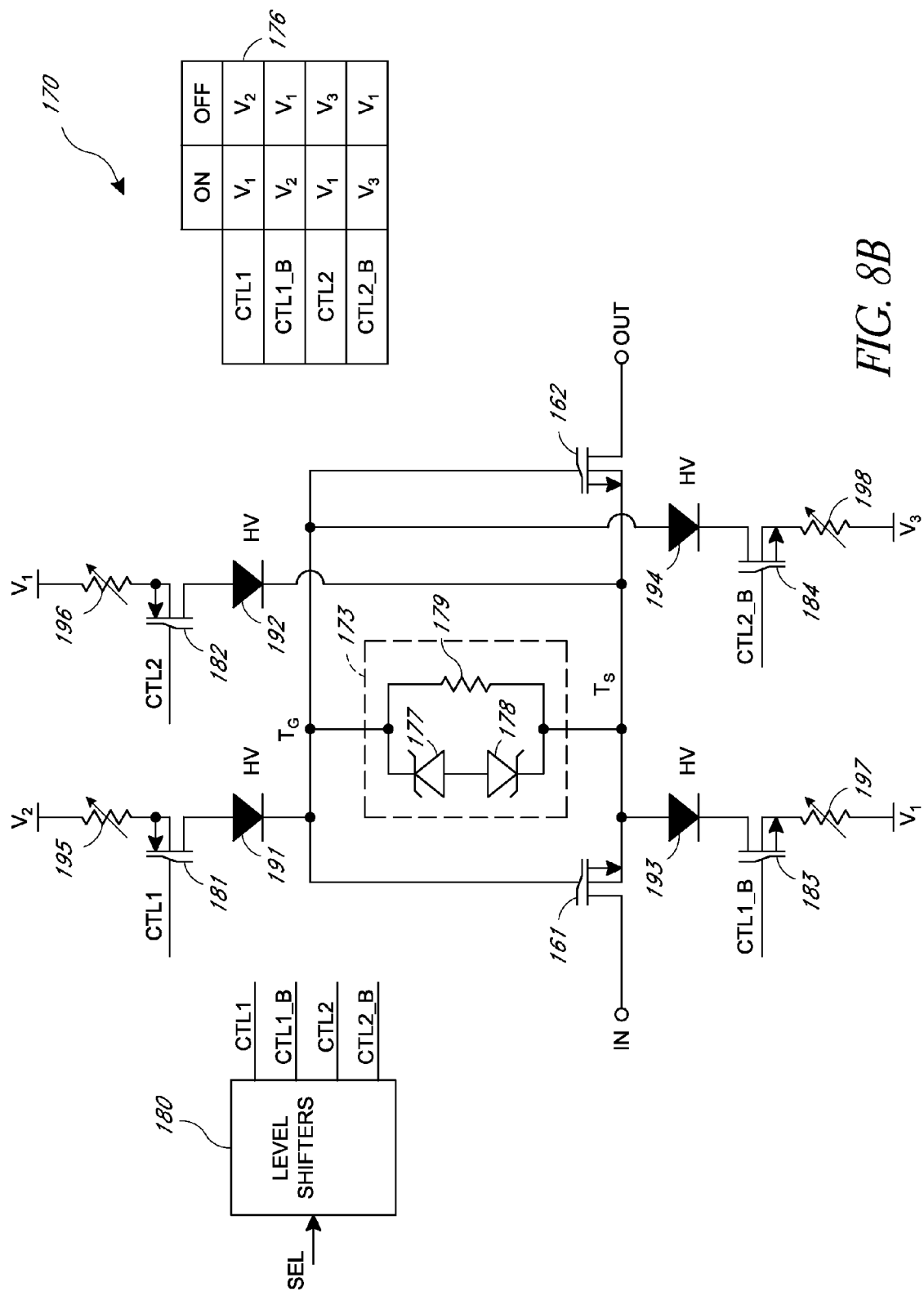
FIG. 8B is a circuit diagram of another embodiment of a high voltage transmit switch.

FIG. 8B is a circuit diagram of another embodiment of a high voltage transmit switch 170. The high voltage transmit switch 170 includes the first and second n-type HVFETs 161, 162, a bias circuit 173, and a bias polarity control circuit that includes level shifters 180, first and second current source p-type HVFETs 181, 182, first and second current source n-type HVFETs 183, 184, first to fourth high voltage diodes 191-194, and first to fourth programmable resistors 195-198.

The first and second n-type HVFETs 161, 162 are electrically connected between the input terminal IN and the output terminal OUT in a manner similar to that described earlier with reference to FIG. 8A. The illustrated bias circuit 173 is electrically connected between the gate node $T_G$ and the source node $N_S$, and includes a first Zener diode 177, a second Zener diode 178 and a resistor 179. The first and second Zener diodes 177, 178 are connected in series between the gate node $T_G$ and the source node $T_S$ and have opposite polarities. For example, the first Zener diode 177 includes a cathode electrically connected to the gate node $T_G$ and an anode electrically connected to the anode of the second Zener diode 178, and the second Zener diode 178 further includes a cathode electrically connected to the source node $T_S$. Although FIG. 8A illustrates a configuration in which the first and second Zener diodes 177, 178 are electrically connected anode-to-anode, in other implementations the first and second Zener diodes 177, 178 are electrically connected cathode-to-cathode. The resistor 179 includes a first end electrically connected to the gate node $T_G$ and a second end electrically connected to the source node $T_S$.

The first high voltage diode 191 includes a cathode electrically connected to the gate node $T_G$ and an anode electrically connected to the drain of the first current source p-type HVFET 181. The first current source p-type HVFET 181 further includes a gate electrically connected to a first output of the level shifters 180 configured to generate a first non-inverted control signal CTL1. The first current source p-type HVFET 181 further includes a source and body electrically connected to a first end of the first programmable resistor 195. The first programmable resistor 195 further includes a second end electrically connected to the second voltage supply $V_2$. The second high voltage diode 192 includes a cathode electrically connected to the source node $T_S$ and an anode electrically connected to the drain of the second current source p-type HVFET 182. The second current source p-type HVFET 182 further includes a gate electrically connected to a second output of the level shifters 180 configured to generate a second non-inverted control signal CTL2. The second current source p-type HVFET 182 further includes a source and body electrically connected to a first end of the second programmable resistor 196. The second programmable resistor 196 further includes a second end electrically connected to the first voltage supply $V_1$.

The third high voltage diode 193 includes an anode electrically connected to the source node $T_S$ and a cathode electrically connected to the drain of the first current source n-type HVFET 183. The first current source n-type HVFET 183 further includes a gate electrically connected to a third output of the level shifters 180 configured to generate a first inverted control signal CTL1_B. The first current source n-type HVFET 183 further includes a source and body electrically connected to a first end of the third programmable resistor 197. The third programmable resistor 197 further includes a second end electrically connected to the first voltage supply $V_1$. The fourth high voltage diode 194 includes an anode electrically connected to the gate node $T_G$ and a cathode electrically connected to the drain of the second current source n-type HVFET 184. The second current source n-type HVFET 184 further includes a gate electrically connected to a fourth output of the level shifters 180 configured to generate a second inverted control signal CTL2_B. The second current source n-type HVFET 184 further includes a source and body electrically connected to a first end of the fourth programmable resistor 198. The fourth programmable resistor 198 further includes a second end electrically connected to the third voltage supply $V_3$.

The second voltage supply $V_2$ can have a voltage greater than a voltage of the first voltage supply $V_1$, and the first voltage supply $V_1$ can have a voltage greater than a voltage of the third voltage supply $V_3$. For example, in one embodiment, the first voltage supply $V_1$ is a ground supply, the second voltage supply $V_2$ is a power high supply, and the third voltage supply $V_3$ is a power low supply.

The level shifters 180 can be used to generate the first non-inverted and inverted control signals CTL1, CTL1_B and the second non-inverted and inverted control signals CTL2, CTL2_B based on a state of the select signal SEL. For example, FIG. 8B has been annotated with a table 176 showing voltage levels of the control signals for one configuration of the level shifters 180. The table 176 of FIG. 8B has been reproduced as Table 1 below.

TABLE 1

|  | ON | OFF |
|---|---|---|
| CTL1 | $V_1$ | $V_2$ |
| CTL1_B | $V_2$ | $V_1$ |
| CTL2 | $V_1$ | $V_3$ |
| CTL2_B | $V_3$ | $V_1$ |

The level shifters 180 can control the voltage level of the control signals so as to turn on or turn off the high voltage transmit switch 170 in response to the select signal SEL. For example, when the select signal SEL indicates that the high voltage transmit switch 170 should be turned on, the control signals of the level shifters 180 can be used to turn on the first current source p-type HVFET 181 and the first current source n-type HVFET 183 and to turn off the second current source p-type HVFET 182 and the second current source n-type HVFET 184. By controlling the current source HVFETs in this manner, a current path can be provided from the second voltage supply $V_2$ to the first voltage supply $V_1$ through the bias circuit 173, thereby generating a voltage difference between gate node $T_G$ and the source node $N_S$ that is about equal to the Zener voltage of the first Zener diode 177. Additionally, when the select signal SEL indicates that the high voltage transmit switch 170 should be turned off, the control signals of the level shifters 180 can be used to turn off the first current source p-type HVFET 181 and the first current source n-type HVFET 183 and to turn on the second current source p-type HVFET 182 and the second current source n-type HVFET 184 so as to provide a current path from the first voltage supply $V_1$ to the third voltage supply $V_3$ through the bias circuit 173. Controlling the current source HVFETs in this manner can reverse a direction of the flow of current through the bias circuit 173 and provide a voltage difference between the source node $T_S$ and the gate node $N_G$ that is about equal to the Zener voltage of the second Zener diode 178.

The bias voltage across the bias circuit 173 can remain substantially constant even when the voltage of the source node $T_S$ moves up or down in response to changing voltage conditions on the input terminal IN. For example, when the high voltage transmit switch 170 is turned on, the voltage of the source node $T_S$ can change with the voltage of the input terminal IN. Additionally, AC coupling between the input terminal IN and the gate node $T_G$ can result in the voltage of the gate node $T_G$ changing with the voltage of the input terminal IN. Accordingly, the bias voltage across the bias circuit 173 can be maintained, such that the voltage of the source node $T_S$ and the voltage of the gate node $T_G$ track or change with the voltage of the input terminal IN so that the first and second n-type HVFETs 161, 162 remain turned on. Additionally, when the high voltage transmit switch 170 is turned off, the bias voltage across the bias circuit 173 can be maintained with changes in the voltage of the source node $T_S$ such that gate-to-source voltage of the first and second n-type HVFETs 161, 162 is less than the HVFETs' threshold voltage and at least one of the first and second n-type HVFETs 161, 162 remain off. In one embodiment, an explicit capacitor is included between the source node $T_S$ and the gate node $T_G$. Including the capacitor can enhance the tracking of the source and gate nodes $T_S$, $T_G$ with changing voltage conditions on the input terminal IN. For example, the capacitor can be included to improve off state tracking, such as in processes in which an off-state parasitic source-to-gate capacitance of the first and second n-type HVFETs 161, 162 is relatively low.

Although FIG. 8B illustrates one example of a high voltage transmit switch in accordance with the teachings herein, persons having ordinary skill in the art will appreciate that the high voltage transmit switches can be implemented in other ways. For example, other configurations of a bias circuit and/or a bias polarity control circuit can be used.

Figure 9A:
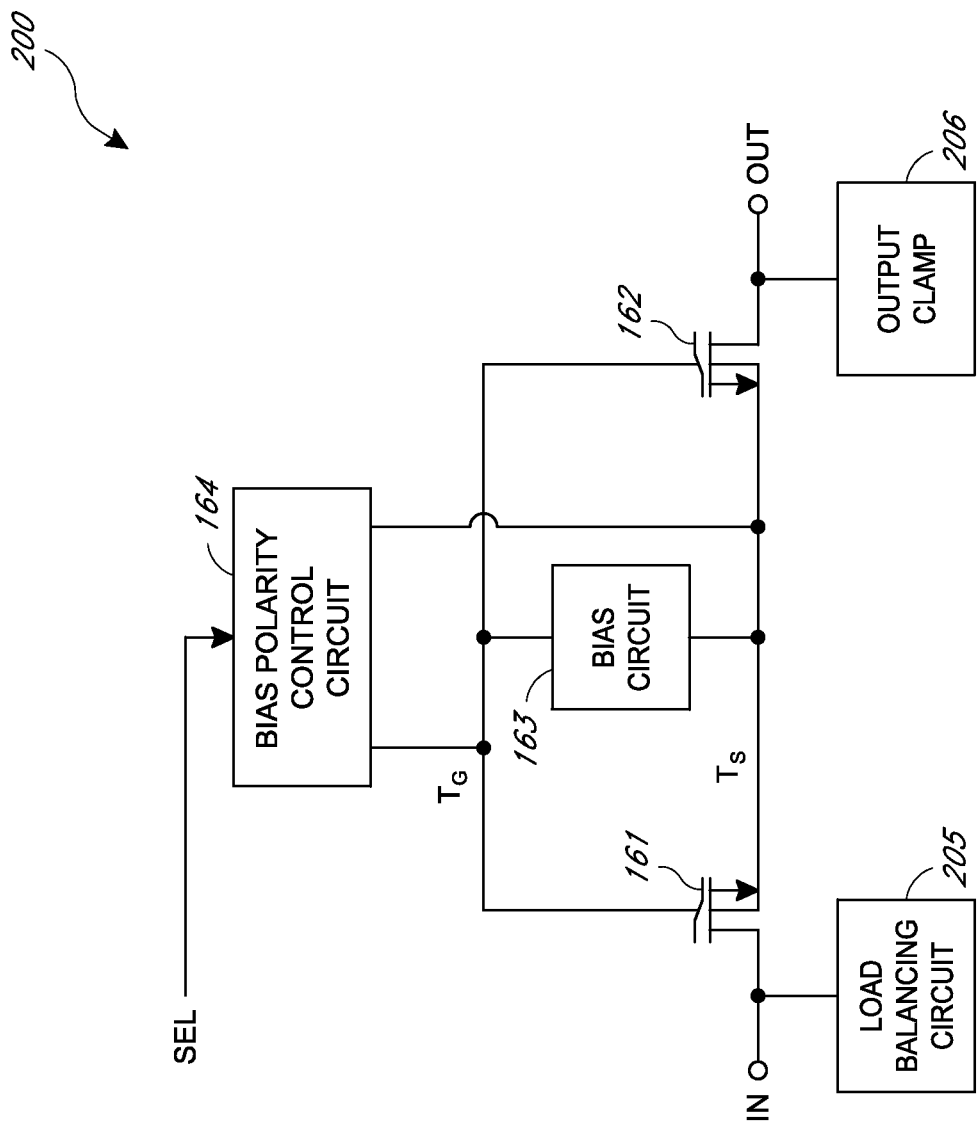
FIG. 9A is a circuit diagram of another embodiment of a high voltage transmit switch.

FIG. 9A is a circuit diagram of another embodiment of a high voltage transmit switch 200. The high voltage transmit switch 200 includes the first and second n-type HVFETs 161, 162, the bias circuit 163, the bias polarity control circuit 164, a load balancing circuit 205, and an output clamp 206.

The high voltage transmit switch 200 of FIG. 9A is similar to the high voltage transmit switch 160 of FIG. 8A, except that the high voltage transmit switch 200 further includes the load balancing circuit 205 and the output clamp 206.

The load balancing circuit 205 can be used to balance or match the load current of a transmitter driving the input terminal IN when the terminal is controlled to a positive high voltage or to a negative high voltage. A difference in current magnitude between a load current for a positive high voltage input and a load current for a negative high voltage input can asymmetrically load an ultrasound console's transmitter, which can result in transmit signal distortion.

The output clamp circuit 206 can be used to clamp the voltage of the output terminal OUT when the select signal SEL indicates that the high voltage transmit switch 200 should be turned off. Including the output clamp circuit 206 can prevent transmit signals received on the input terminal IN from reaching the output terminal OUT by way of, for example, AC coupling through source-to-drain parasitic capacitors associated with the first and second n-type HVFETs 161, 162. Additional details of the high voltage transmit switch 200 can be similar to those described earlier.

Figure 9B:
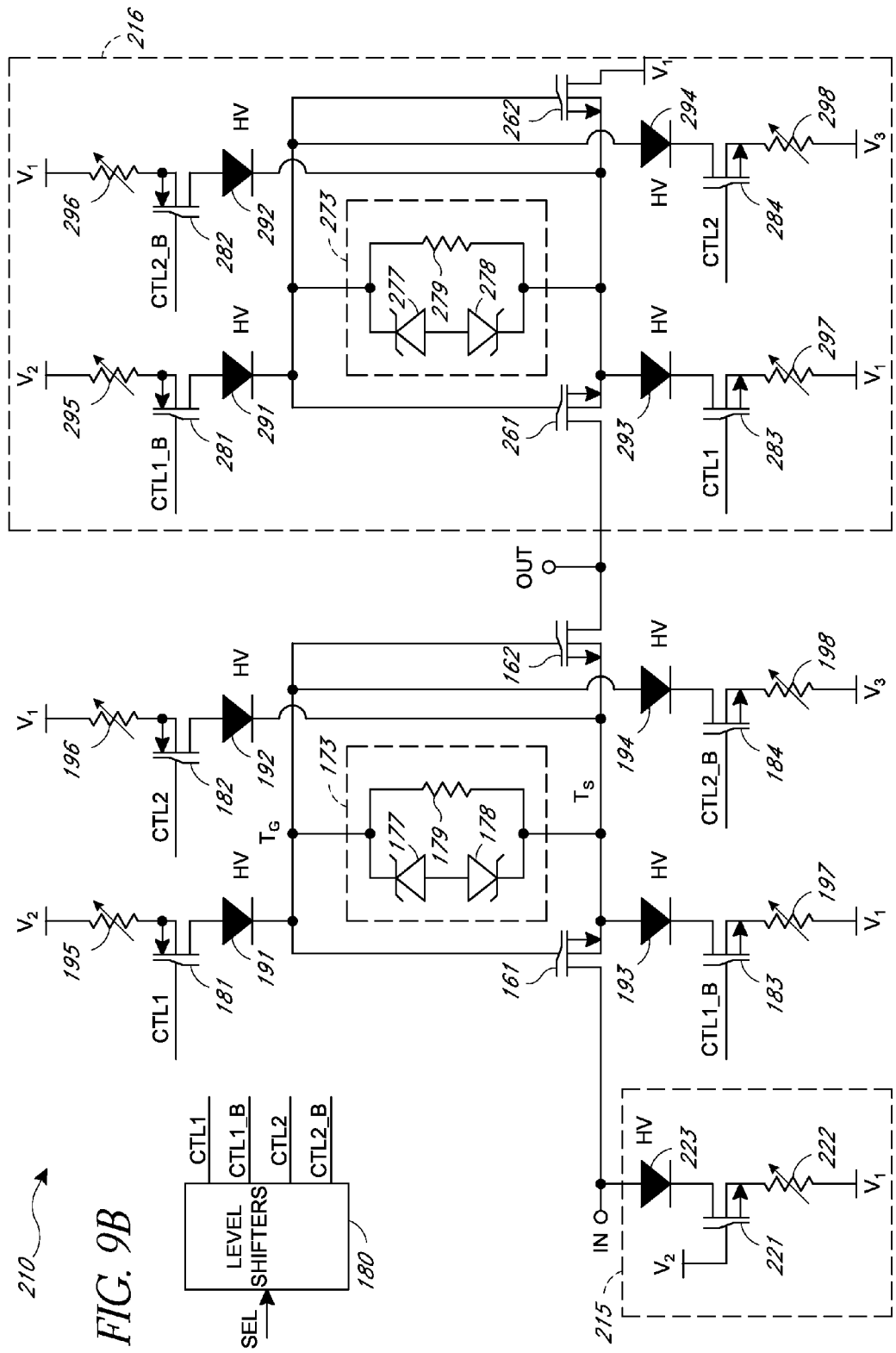
FIG. 9B is a circuit diagram of another embodiment of a high voltage transmit switch.

FIG. 9B is a circuit diagram of another embodiment of a high voltage transmit switch 210. Certain components of the high voltage transmit switch 210 of FIG. 9B are similar to those of the high voltage transmit switch 170 of FIG. 8B. For example, the high voltage transmit switch 210 includes the first and second n-type HVFETs 161, 162, the bias circuit 173, the level shifters 180, the first and second current source p-type HVFETs 181, 182, the first and second current source n-type HVFETs 183, 184, the first to fourth high voltage diodes 191-194, and the first to fourth programmable resistors 195-198, which can be as described earlier with respect to FIG. 8B. However, in contrast to the high voltage transmit switch 170 of FIG. 8B, the high voltage transmit switch 210 of FIG. 9B further includes a load balancing circuit 215 and an output clamp 216.

The load balancing circuit 215 can be used to can be used to balance or match the load current of a circuit driving the input terminal IN when the terminal is controlled to a positive high voltage or to a negative high voltage. For example, when the high voltage transmit switch 210 is disabled, absent load balancing the high voltage transmit switch 210 can have a different current load for a positive high voltage and for a negative high voltage received at the input terminal IN. For instance, when a negative high voltage is received on the input terminal IN and the high voltage transmit switch 210 is turned off, there can be a load current path between the first voltage supply $V_1$ and the input terminal IN through the drain-to-body parasitic diode of the first n-type HVFET 161 and the second high voltage diode 192. However, when a positive high voltage is received on the input terminal IN and the high voltage transmit switch 210 is turned off, the drain-to-body parasitic diode of the first n-type HVFET 161 can be reversed biased, and thus a corresponding load current path may not be present.

To aid in balancing load currents, the load balancing circuit 215 has been included. The load balancing circuit 215 includes a high voltage diode 223, a load balancing n-type HVFET 221, and a programmable resistor 222. The high voltage diode 223 includes an anode electrically connected to the input terminal IN and a cathode electrically connected to a drain of the load balancing n-type HVFET 221. The load balancing n-type HVFET 221 further includes a gate electrically connected to the second voltage supply $V_2$, and a source and body electrically connected to a first end of the first programmable resistor 222. The first programmable resistor 222 further includes a second end electrically connected to the first voltage supply $V_1$.

The load balancing circuit 215 can provide load balancing such that a magnitude of the load current of the high voltage transmit switch 210 is about the same when a positive high voltage or a negative high voltage is received on the input terminal IN. For example, when a negative high voltage is received on the input terminal IN and the high voltage transmit switch 210 is turned off, there can be a load current path between the first voltage supply $V_1$ and the input terminal IN through the drain-to-body parasitic diode of the first n-type HVFET 161 and the second high voltage diode 192. The load balancing circuit 215 can be used to balance this load current by providing a corresponding load current path when a positive high voltage is received on the input terminal IN.

Additionally, when a negative high voltage is received on the input terminal IN and the high voltage transmit switch 210 is turned on, there can be load current paths between the first voltage supply $V_1$ and the input terminal IN both through the first high voltage diode 191 and through a second high voltage diode 292 of the output clamp 216. To balance these currents, the load balancing circuit 215 and the third high voltage diode 193 can provide corresponding load current paths when a positive high voltage is received on the input terminal IN and the switch is turned on.

The output clamp 216 includes a first terminal electrically connected to the output terminal OUT and a second terminal electrically connected to the first voltage supply $V_1$. The output clamp 216 has been configured to have a structure similar to the high voltage transmit switch 170 of FIG. 8B. For example, the output clamp 216 includes first and second current source p-type HVFETs 281, 282, first and second current source n-type HVFETs 283, 284, first to fourth high voltage diodes 291-294, and first to fourth programmable resistors 295-298, which can be similar to the first and second current source p-type HVFETs 181, 182, the first and second current source n-type HVFETs 183, 184, the first to fourth high voltage diodes 191-194, and the first to fourth programmable resistors 195-198 of FIG. 8B, respectively. However, in contrast to the high voltage transmit switch 170 of FIG. 8B, the output clamp 216 has been configured to turn on when the select signal SEL indicates that the high voltage transmit switch should be disabled and to turn off when the select signal SEL indicates that the high voltage transmit switch should be enabled. In particular, the gate of the first current source p-type HVFET 281 has been configured to receive the first inverted control signal CTL1_B, the gate of the first current source n-type HVFET 283 has been configured to receive the first non-inverted control signal CTL1, the gate of the second current source p-type HVFET 282 has been configured to receive the second inverted control signal CTL2_B, and the gate of the second current source n-type HVFET 284 has been configured to receive the second non-inverted control signal CTL2.

In certain embodiments, an output clamp of a high voltage transmit switch is implemented to be a replica of a portion of the high voltage transmit switch, but is configured to turn on when the high voltage transmit switch is turned off and to turn off when the high voltage transmit switch is turned on. For example, in one embodiment, the output clamp includes a scaled or full replica of the n-type HVFETs 161, 162 and the bias circuit 173. Including the output clamp can aid in preventing the voltage of the transmit switch's output terminal OUT from changing when the transmit switch is turned off.

Figure 10A:
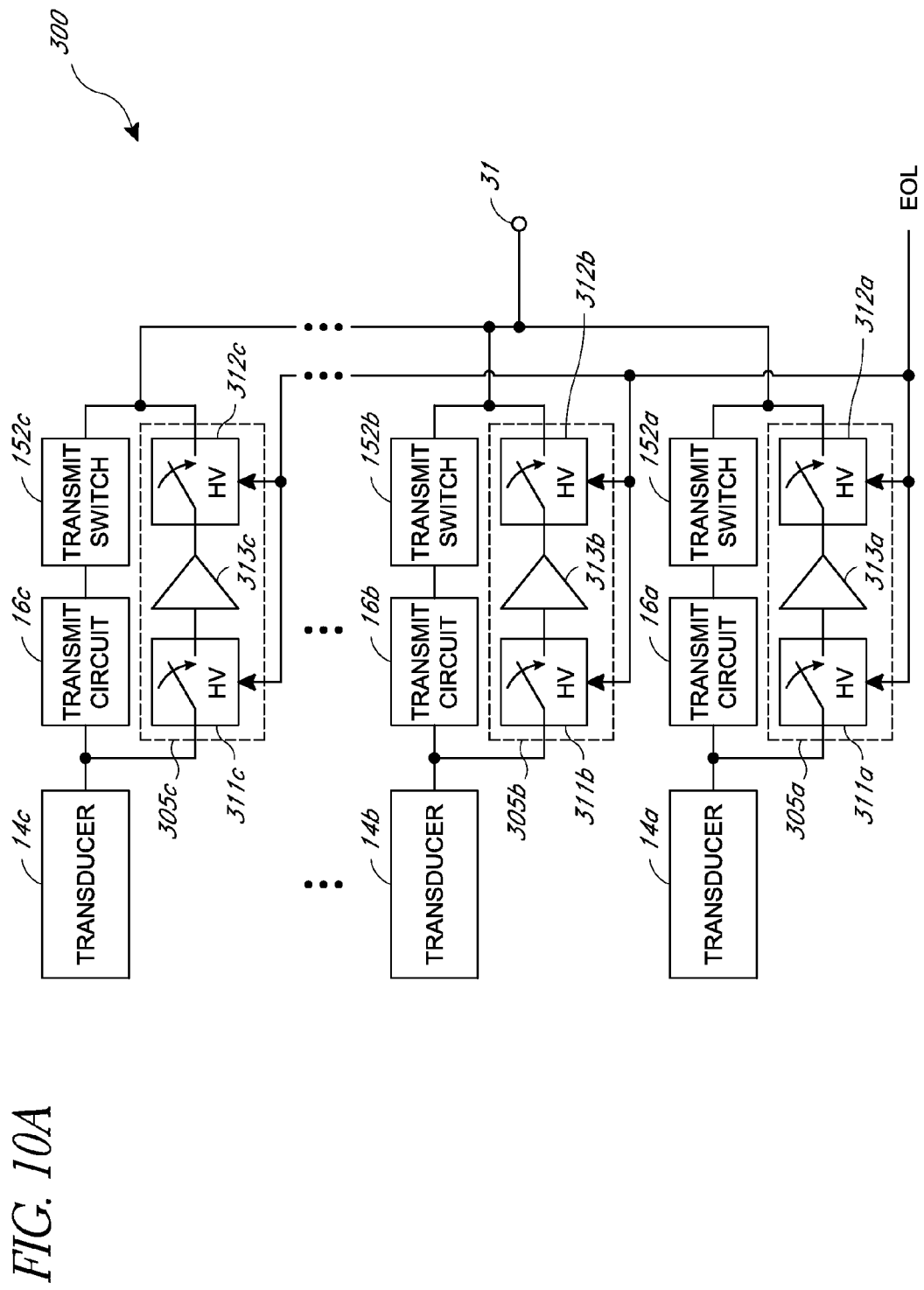
FIG. 10A is a schematic block diagram of another embodiment of an ultrasound probe.

FIG. 10A is a schematic block diagram of another embodiment of an ultrasound probe 300.

Certain components of the ultrasound probe 300 of FIG. 10A are similar to those of the ultrasound probe 151 of FIG. 7. For example, the ultrasound probe 300 of FIG. 10A includes the first to third transducers 14a-14c, the first to third transmit circuits 16a-16c, and the first to third high voltage transmit switches 152a-152c, which can be similar to those described earlier with respect to the ultrasound probe 151 of FIG. 7. However, in contrast to the ultrasound probe 151 of FIG. 7, the ultrasound probe 300 of FIG. 10A includes a different arrangement of switch protected amplifiers. For example, the ultrasound probe 300 includes first to third switch protected amplifiers 305a-305c. The first switch protected amplifier 305a includes an amplifier 313a electrically connected between a first high voltage receive switch 311a and a second high voltage receive switch 312b. Additionally, the second switch protected amplifier 305b includes an amplifier 313b electrically connected between the first high voltage receive switch 311b and the second high voltage receive switch 312b. Furthermore, the third switch protected amplifier 305c includes an amplifier 313c electrically connected between the first high voltage receive switch 311c and the second high voltage receive switch 312c. Although the ultrasound probe 300 is illustrated as including three channels, the ultrasound probe 300 can be adapted to include more or fewer channels.

In the illustrated configuration, each of the high voltage receive switches has been configured to receive an end of line (EOL) signal. As will be described below, configuring a high voltage receive switch to receive the EOL signal can aid in reducing distortion of an ultrasound probe, particularly in configurations in which multiple transducers are multiplexed to a cable. For example, as was described earlier with respect to FIGS. 2-6, a high voltage receive switch can be configured to turn off or open when a high voltage condition is detected on the receive switch's high voltage terminal. However, during the receive switch's transition from on to off, the receive switch can load the ultrasound system's transmitter, thereby distorting a transmit signal generated by the transmitter. The transmit signal distortion can be exacerbated in configurations in which transducers are multiplexed, since such configurations can be associated with multiple high voltage receive switches loading the ultrasound cable that the transmitter is driving.

The EOL signal can be sent by an ultrasound console to an ultrasound probe, and can indicate the end of an ultrasound scan line, such as the end of one transmit and receive cycle. The EOL signal can be used to turn off the receive switches before the transmit signal reaches the receive switches, thereby avoiding distortion associated with the receive switches' transient turn off time. However, each of the high voltage receive switches can continue to sense a voltage at the receive switch's high voltage input terminal, and can turn on once a high voltage transmit signal has been detected and passed. Accordingly, after a transmit signal has been sent to a particular transducer, an associated high voltage receive switch can turn back on, thereby allowing passage of a receive signal generated by the transducer.

Figure 10B:
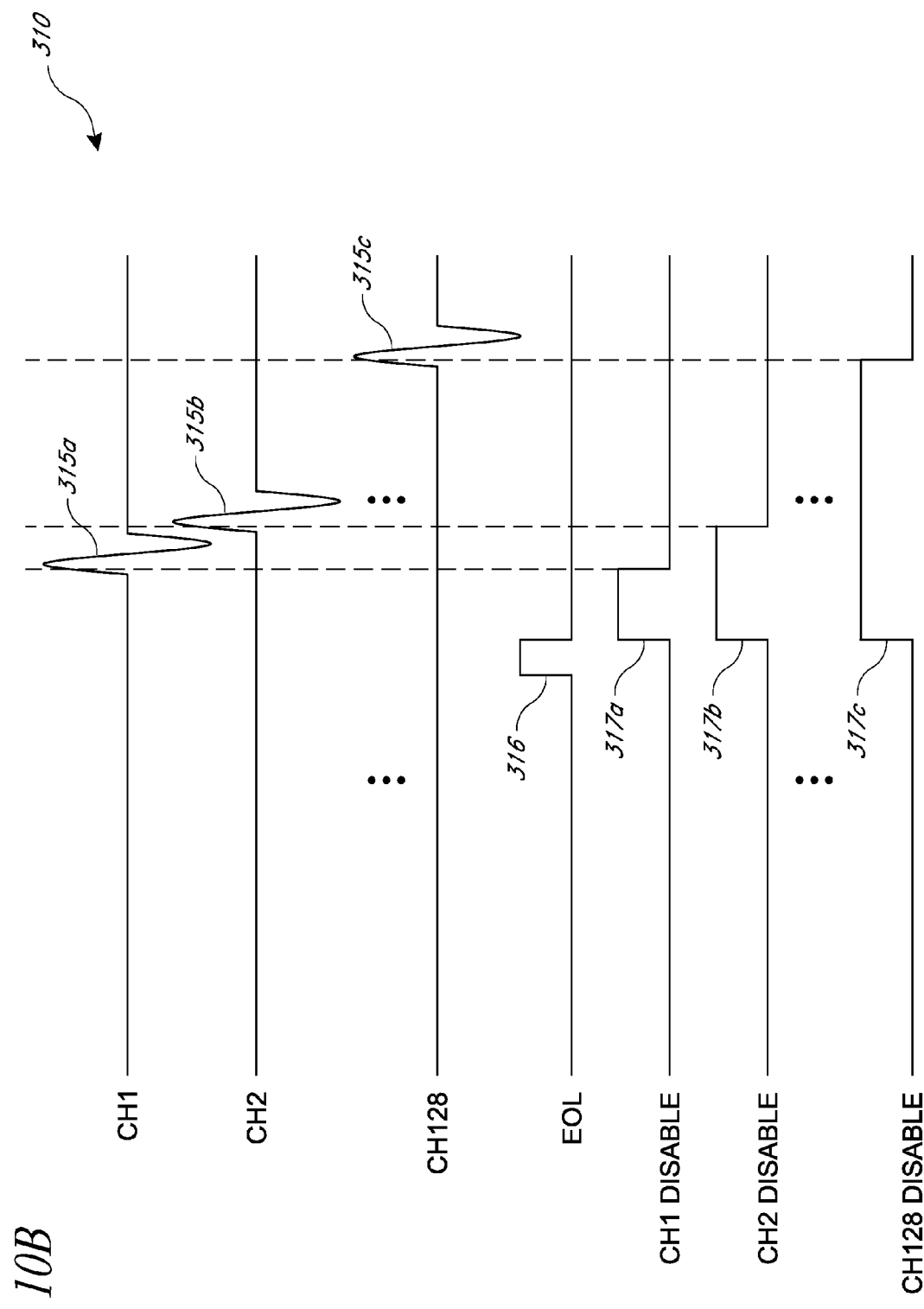
FIG. 10B shows an example of a timing diagram for one implementation of the ultrasound probe of FIG. 10A.

FIG. 10B shows an example of a timing diagram 310 for one implementation of the ultrasound probe 300 of FIG. 10A. The timing diagram 310 illustrates timing for a configuration of the ultrasound probe 300 including 128 channels and associated transducers.

The timing diagram 310 includes a first plot 315a of the voltage of a first channel (CH1), a second plot 315b of the voltage of a second channel (CH2), and a third plot 315c of the voltage of a one hundred and twenty-eighth channel (CH128). The timing diagram 310 further illustrates a fourth plot 316 of an end-of-line (EOL) signal. Additionally, the timing diagram 310 includes a fifth plot 317a of a CH1 disable control signal used to turn off a high voltage receive switch of CH1, a sixth plot 317b of a CH2 disable control signal used to turn off a high voltage receive switch of CH2, and a seventh plot 317c of a CH128 disable control signal used to turn off a high voltage receive switch of CH128.

As illustrated in FIG. 10B, each of the channels CH1, CH2, and CH128 can be configured to turn off in response to the EOL signal. In the illustrated configuration, the receive switches of a channel are configured to turn off in response to a falling edge of the EOL signal. However, other configurations are possible, including implementations in which the receive switches turn off in response to a rising edge of the EOL signal and/or implementations in which the receive switches turn off after a delay in a transition of the EOL signal.

As illustrated in the timing diagram 310, the channel disable signals shown in the fifth to seventh plots 317a-317c can deactivate once a high voltage condition is detected by the receive switch. For example, the CH1 disable signal shown in the fifth plot 317a has deactivated in response to the high voltage transmit signal shown in the first plot 315a. Similarly, the CH2 and CH128 disable signals shown in the sixth and seventh plots 317b, 317c have deactivated in response to the high voltage transmit signals shown in the second and third plots 315b, 315c, respectively. The high voltage receive switches can remain off until passage of the high voltage transmit signals, but thereafter can turn on so as to pass receive signals associated with echo signals generated in response to the transmit signals.

Figure 11A:
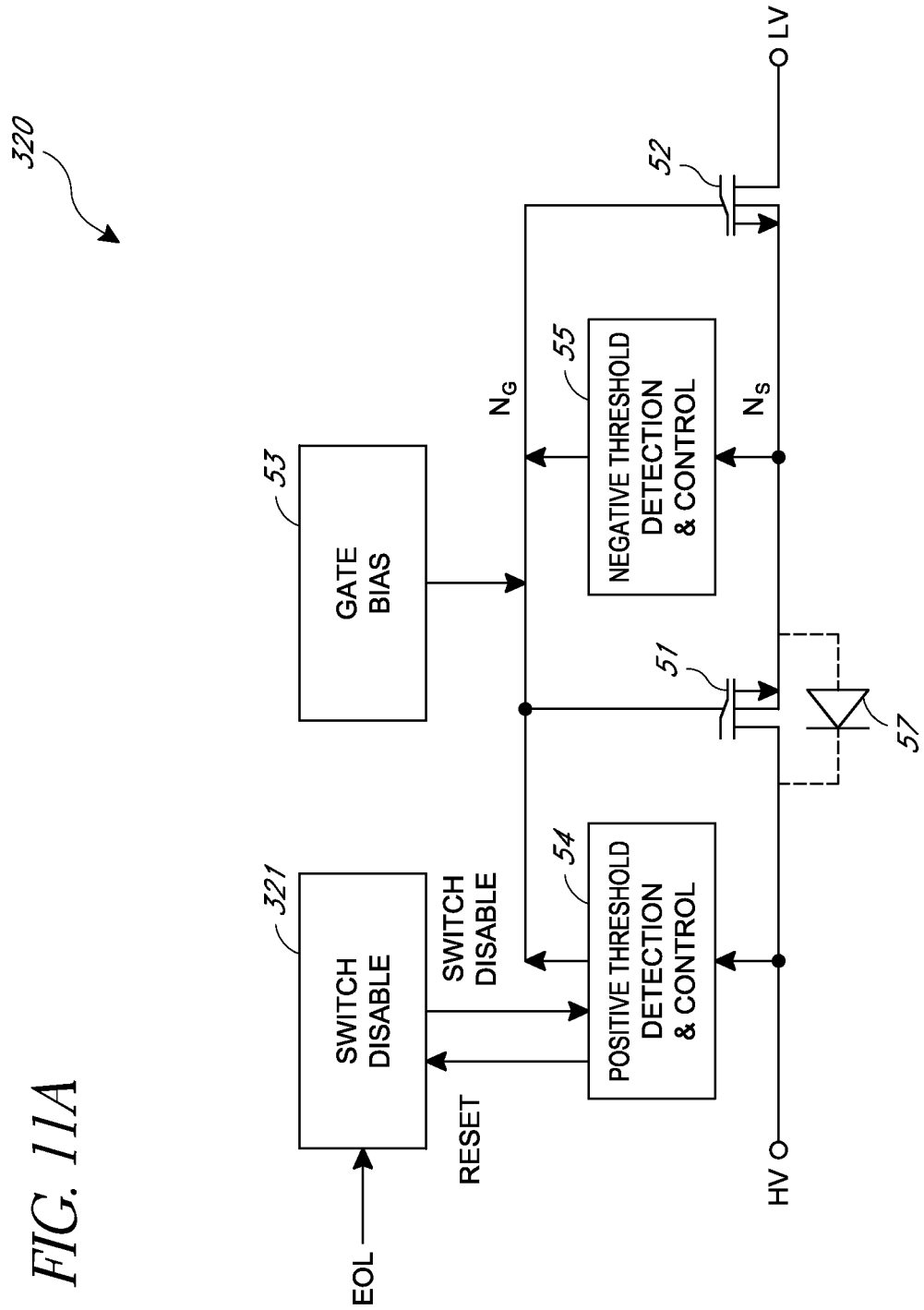
FIG. 11A is a circuit diagram of another embodiment of a high voltage receive switch.

FIG. 11A is a circuit diagram of another embodiment of a high voltage receive switch 320. The high voltage receive switch 320 includes the first and second n-type HVFETs 51, 52, the gate bias circuit 53, the positive threshold detection and control circuit 54, the negative threshold detection and control circuit 55, and a switch disable circuit 321.

The high voltage receive switch 320 of FIG. 11A is similar to the high voltage receive switch 50 of FIG. 3, except that the high voltage receive switch 320 further includes the switch disable circuit 321.

The switch disable circuit 321 is configured to receive an EOL signal, which can be used to turn off the high voltage receive switch 320. In the illustrated configuration, the switch disable circuit 321 has been configured to send a switch disable signal to the positive threshold detection and control circuit 54, which can use the switch disable signal to bias the gate node $N_G$ so as to turn off the first and second n-type HVFETs 51, 52. Additionally, once a high voltage transmit signal is detected on the high voltage terminal HV by the positive threshold detection and control circuit 54, the positive threshold detection and control circuit 54 can send a reset signal to the switch disable circuit 321. The switch disable circuit 321 can use the reset signal to deactivate the switch disable signal. Once a high voltage condition has passed and the positive threshold detection and control circuit 54 and the negative threshold detection and control circuit 55 no longer detected high voltage conditions, the gate bias circuit 53 can control the voltage of the gate node $N_G$ so as to turn on the high voltage receive switch 320. Additional details of the high voltage receive signal 320 can be similar to those described earlier.

Figure 11B:
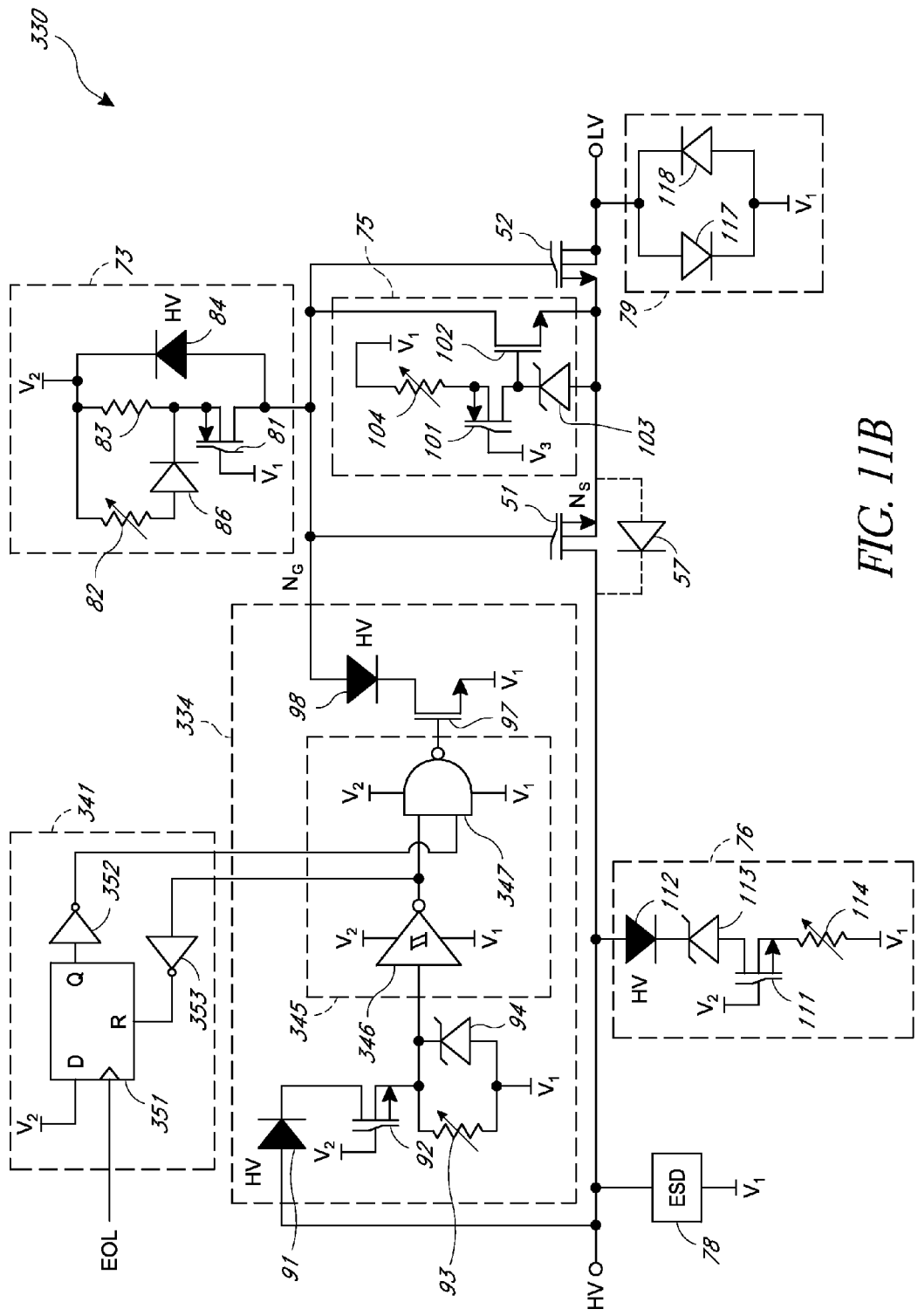
FIG. 11B is a circuit diagram of another embodiment of a high voltage receive switch.

FIG. 11B is a circuit diagram of another embodiment of a high voltage receive switch 330. The high voltage receive switch 330 includes the first and second n-type HVFETs 51, 52, the gate bias circuit 73, the negative threshold detection and control circuit 75, the load balancing circuit 76, the ESD protection circuit 78, the amplifier protection circuit 79, a positive threshold detection and control circuit 334, and a switch disable circuit 341. The high voltage receive switch 330 of FIG. 11B is similar to the high voltage receive switch 70 of FIG. 5, except that the high voltage receive switch 330 further includes the switch disable circuit 341 and includes a different arrangement of a positive threshold detection and control circuit.

The switch disable circuit 341 includes a flip-flop 351, a first inverter 352, and a second inverter 353. The flip-flop 351 includes a clock input configured to receive the EOL signal, a data input electrically connected to the second voltage supply $V_2$, a data output electrically connected to an input of the first inverter 352, and a reset input electrically connected to an output of the second inverter 353. The first inverter 352 further includes an output configured to generate a switch disable signal. The second inverter 353 further includes an input configured to receive a reset signal.

The positive threshold detection and control circuit 334 of FIG. 11B is similar to the positive threshold detection and control circuit 74 of FIG. 5, except that the positive threshold detection and control circuit 334 includes a different arrangement of a comparator. In particular, the positive threshold detection and control circuit 334 includes a comparator 345 including a Schmitt trigger 346 and a NAND gate 347. As shown in FIG. 11B, the Schmitt trigger 346 includes an input electrically connected to an input of the comparator 345, and an inverting output configured to generate the reset signal, which is provided to a first input of the NAND gate 347 and to the switch disable circuit 341. The NAND gate 347 further includes a second input configured to receive the switch disable signal from the switch disable circuit 341 and an output configured to generate the output of the comparator 345.

On a designated transition of the EOL signal, the flip-flop 351 or other memory element of the switch disable circuit 341 can load a data value indicating that the high voltage receive switch 330 should be disabled. The flip-flop 351 can thereafter generate a switch disable signal for the positive threshold detection and control circuit 334 such that the positive threshold detection and control circuit 334 disables the high voltage receive switch 330. Since the EOL signal can be configured to transition prior to generation of a high voltage transmit signal, the high voltage receive switch 330 can already be disabled when the high voltage transmit signal is received on the high voltage terminal HV. However, the positive threshold detection and control circuit 334 can detect the high voltage transmit signal on the high voltage terminal HV, and the comparator 345 can generate the reset signal for the switch disable circuit 341. The positive threshold detection and control circuit 334 can maintain the high voltage receive switch 330 in a disabled state until the positive threshold detection and control circuit 334 no longer detects the positive high voltage condition on the high voltage terminal HV. After passage of the high voltage transmit signal, the gate bias circuit 73 can turn the high voltage receive switch 330 on so that the high voltage receive switch 330 will pass a low voltage receive signal when the receive signal reaches the high voltage terminal HV. Additional details of the high voltage receive switch 330 can be similar to those described earlier.

Although FIG. 11B illustrates one possible implementation of a high voltage receive switch using a switch disable circuit that can disable the receive switch in response to an EOL signal, persons having ordinary skill in the art will appreciate that the teachings herein are applicable to other configurations of high voltage receive switches.

Figure 12:
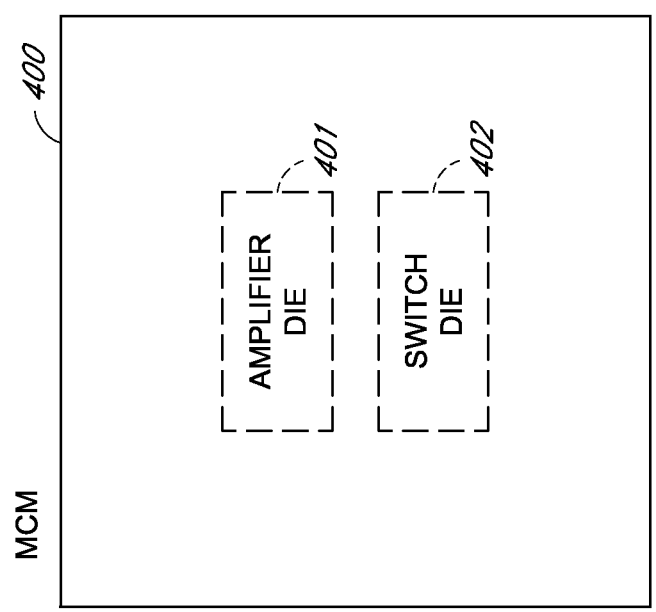
FIG. 12 is a schematic block diagram of one embodiment of a multi-chip module (MCM).

FIG. 12 is a schematic block diagram of one embodiment of a multi-chip module (MCM) 400. The MCM 400 includes an amplifier die 401 and a switch die 402. In certain implementations, the MCM 400 can be used to implement ultrasound probe circuitry, such as a switch protected amplifier. For example, in one embodiment, the amplifier die 401 includes the amplifier 43 of FIG. 2, and the switch die 402 includes the first and second high voltage receive switches 41, 42 of FIG. 2. However, other configurations are possible, including, for example, implementations in which a switch protected amplifier is fabricated on a single die. In one embodiment, the amplifier die 401 and the switch die 402 are stacked.

Applications

Devices employing the above described schemes can be implemented into various electronic systems, including, for example, ultrasound systems. However, the teachings herein can be applicable in other electronic systems, including for example, those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A transmit switch comprising:
a first terminal;
a second terminal;
a first field effect transistor (FET) including a drain electrically connected to the first terminal, a gate electrically connected to a gate node, and a source electrically connected to a source node;
a second FET including a drain electrically connected to the second terminal, a source electrically connected to the source node, and a gate electrically connected to the gate node;
a bias circuit electrically connected between the gate node and the source node; and
a bias polarity control circuit electrically connected between the gate node and the source node and configured to receive a control signal, wherein the bias polarity control circuit is configured to turn on the first and second FETs by generating a bias voltage across the bias circuit when the control signal indicates that the transmit switch should be enabled, and wherein the bias polarity control circuit is configured to turn off the first and second FETs by reversing a polarity of the bias voltage when the control signal indicates that the transmit switch should be disabled,
wherein the bias circuit comprises a first Zener diode and a second Zener diode electrically connected in series between the gate node and the source node, wherein the first and second Zener diodes have opposite polarity.

2. The transmit switch of claim 1, wherein the bias circuit further comprises a resistor electrically connected between the gate node and the source node, wherein the resistor is electrically connected in parallel with the first and second Zener diodes.

3. The transmit switch of claim 1, further comprising an output clamp electrically connected between the second terminal and a ground supply, wherein the output clamp is configured to turn off when the control signal indicates that the transmit switch should be enabled, and wherein the output clamp is configured to turn on and electrically connect the second terminal to the ground supply when the control signal indicates that the transmit switch should be disabled.

4. The transmit switch of claim 1, further comprising a load balancing circuit electrically connected to the first terminal, wherein the load balancing circuit is configured to balance a first load current associated with a first voltage received at the first terminal and a second load current associated with a second voltage received at the first terminal.

5. The transmit switch of claim 1, wherein the bias polarity control circuit is configured to control the polarity of the bias voltage by controlling a direction of a flow of current through the bias circuit.

6. A transmit switch comprising:
a first terminal;
a second terminal;
a first field effect transistor (FET) including a drain electrically connected to the first terminal, a gate electrically connected to a gate node, and a source electrically connected to a source node;
a second FET including a drain electrically connected to the second terminal, a source electrically connected to the source node, and a gate electrically connected to the gate node;
a bias circuit electrically connected between the gate node and the source node; and
a bias polarity control circuit electrically connected between the gate node and the source node and configured to receive a control signal, wherein the bias polarity control circuit is configured to turn on the first and second FETs by generating a bias voltage across the bias circuit when the control signal indicates that the transmit switch should be enabled, and wherein the bias polarity control circuit is configured to turn off the first and second FETs by reversing a polarity of the bias voltage when the control signal indicates that the transmit switch should be disabled,
wherein the bias polarity control circuit further comprises:
a first diode and a first current source transistor electrically connected in series between the gate node and a power high supply, wherein a cathode of the first diode is electrically connected to the gate node;
a second diode and a second current source transistor electrically connected in series between the source node and a ground supply, wherein a cathode of the second diode is electrically connected to the source node;
a third diode and a third current source transistor electrically connected in series between the source node and the ground supply, wherein an anode of the third diode is electrically connected to the source node; and
a fourth diode and a fourth current source transistor electrically connected in series between the gate node and a power low supply, wherein an anode of the fourth diode is electrically connected to the gate node.

7. The transmit switch of claim 6, further comprising a plurality of level shifters configured to control the first, second, third, and fourth current source transistors, wherein the plurality of level shifters are configured to turn on the first and third current source transistors and to turn off the second and fourth current source transistors when the control signal indicates that the transmit switch should be enabled, and wherein the plurality of level shifters are configured to turn off the first and third current source transistors and to turn on the second and fourth current source transistors when the control signal indicates that the transmit switch should be disabled.

8. The transmit switch of claim 7, further comprising:
a first resistor electrically connected in series between a source of the first current source transistor and the power high supply;
a second resistor electrically connected in series between a source of the second current source transistor and the ground supply;
a third resistor electrically connected in series between a source of the third current source transistor and the ground supply; and
a fourth resistor electrically connected in series between a source of the fourth current source transistor and the power low supply.

9. A transmit switch comprising:
a first terminal;
a second terminal;
a first field effect transistor (FET) including a drain electrically connected to the first terminal, a gate electrically connected to a gate node, and a source electrically connected to a source node;
a second FET including a drain electrically connected to the second terminal, a source electrically connected to the source node, and a gate electrically connected to the gate node;
a bias circuit electrically connected between the gate node and the source node;
a bias polarity control circuit electrically connected between the gate node and the source node and configured to receive a control signal, wherein the bias polarity control circuit is configured to turn on the first and second FETs by generating a bias voltage across the bias circuit when the control signal indicates that the transmit switch should be enabled, and wherein the bias polarity control circuit is configured to turn off the first and second FETs by reversing a polarity of the bias voltage when the control signal indicates that the transmit switch should be disabled; and
an output clamp electrically connected between the second terminal and a ground supply, wherein the output clamp is configured to turn off when the control signal indicates that the transmit switch should be enabled, and wherein the output clamp is configured to turn on and electrically connect the second terminal to the ground supply when the control signal indicates that the transmit switch should be disabled,
wherein the output clamp comprises a replica of the first FET, the second FET, the bias circuit, and at least a portion of the bias polarity control circuit.

10. A transmit switch comprising:
a first terminal;
a second terminal;
a first field effect transistor (FET) including a drain electrically connected to the first terminal, a gate electrically connected to a gate node, and a source electrically connected to a source node;
a second FET including a drain electrically connected to the second terminal, a source electrically connected to the source node, and a gate electrically connected to the gate node;
a bias circuit electrically connected between the gate node and the source node;
a bias polarity control circuit electrically connected between the gate node and the source node and configured to receive a control signal, wherein the bias polarity control circuit is configured to turn on the first and second FETs by generating a bias voltage across the bias circuit when the control signal indicates that the transmit switch should be enabled, and wherein the bias polarity control circuit is configured to turn off the first and second FETs by reversing a polarity of the bias voltage when the control signal indicates that the transmit switch should be disabled; and a load balancing circuit electrically connected to the first terminal, wherein the load balancing circuit is configured to balance a first load current associated with a first voltage received at the first terminal and a second load current associated with a second voltage received at the first terminal, wherein the load balancing circuit comprises:
- a load balancing diode including an anode electrically connected to the first terminal and a cathode;
- a load balancing FET including a gate electrically connected to a power high supply, a drain electrically connected to the cathode of the load balancing diode, and a source; and
- a load balancing resistor including a first end electrically connected to the source of the load balancing FET and a second end electrically connected to a ground supply.

11. A transmit switch comprising:
a first terminal;
a second terminal;
a first field effect transistor (FET) including a drain electrically connected to the first terminal, a gate electrically connected to a gate node, and a source electrically connected to a source node;
a second FET including a drain electrically connected to the second terminal, a source electrically connected to the source node, and a gate electrically connected to the gate node;
a means for biasing electrically connected between the gate node and the source node;
a means for bias polarity control electrically connected between the gate node and the source node and configured to receive a control signal, wherein the bias polarity control means is configured to turn on the first and second FETs by generating a bias voltage across the biasing means when the control signal indicates that the transmit switch should be enabled, and wherein the bias polarity control means is configured to turn off the first and second FETs by reversing a polarity of the bias voltage when the control signal indicates that the transmit switch should be disabled; and
a means for clamping electrically connected between the second terminal and a ground supply, wherein the clamping means is configured to turn off when the control signal indicates that the transmit switch should be enabled, and wherein the clamping means is configured to turn on and electrically connect the second terminal to the ground supply when the control signal indicates that the transmit switch should be disabled,
wherein the clamping means comprises a replica of the first FET, the second FET, the biasing means, and at least a portion of the bias polarity control means.

12. The transmit switch of claim 11, further comprising a means for load balancing electrically connected to the first terminal, wherein the load balancing means is configured to balance a first load current associated with a first voltage received at the first terminal and a second load current associated with a second voltage received at the first terminal.

13. A method of switching in an ultrasound probe, the method comprising:
receiving an ultrasound transmit signal on an input terminal of a transmit switch, the transmit switch comprising a first field effect transistor (FET) and a second FET, wherein the first FET includes a drain electrically connected to the input terminal, a gate electrically connected to a gate node, and a source electrically connected to a source node, and wherein the second FET includes a drain electrically connected to an output terminal, a source electrically connected to the source node, and a gate electrically connected to the gate node;
receiving a control signal into a control terminal of the transmit switch;
switching on the transmit switch when the control signal indicates that that the transmit switch should be enabled, wherein switching on the transmit switch comprises turning on the first and second FETs by generating a bias voltage across a bias circuit electrically connected between the gate node and the source node;
switching off the transmit switch when the control signal indicates that the transmit switch should be disabled, wherein switching off the transmit switch comprises turning off the first and second FETs by reversing a polarity of the bias voltage across the bias circuit;
clamping the output terminal to a ground supply by turning on an output clamp when the control signal indicates that the transmit switch should be disabled; and
balancing a load current using a load balancing circuit electrically connected to the input terminal, wherein balancing the load current comprises matching a first load current associated with a first transmit voltage received at the input terminal and a second load current associated with a second transmit voltage received at the input terminal.

14. The method of claim 13, wherein generating the bias voltage across the bias circuit comprises controlling a direction of a flow of current through the bias circuit.

15. A method of switching in an ultrasound probe, the method comprising:
receiving an ultrasound transmit signal on an input terminal of a transmit switch, the transmit switch comprising a first field effect transistor (FET) and a second FET, wherein the first FET includes a drain electrically connected to the input terminal, a gate electrically connected to a gate node, and a source electrically connected to a source node, and wherein the second FET includes a drain electrically connected to an output terminal, a source electrically connected to the source node, and a gate electrically connected to the gate node;
receiving a control signal into a control terminal of the transmit switch;
switching on the transmit switch when the control signal indicates that that the transmit switch should be enabled, wherein switching on the transmit switch comprises turning on the first and second FETs by generating a bias voltage across a bias circuit electrically connected between the gate node and the source node; and
switching off the transmit switch when the control signal indicates that the transmit switch should be disabled, wherein switching off the transmit switch comprises turning off the first and second FETs by reversing a polarity of the bias voltage across the bias circuit,
wherein the bias circuit comprises a first Zener diode and a second Zener diode electrically connected in series between the gate node and the source node, wherein the first and second Zener diodes have opposite polarity, and wherein the bias circuit further comprises a resistor electrically connected between the gate node and the source node, wherein the resistor is electrically connected in parallel with the first and second Zener diodes.

* * * * *

UNITED STATES PATENT AND TRADEMARK OFFICE
CERTIFICATE OF CORRECTION

PATENT NO. : 9,178,507 B2  
APPLICATION NO. : 13/687739  
DATED : November 3, 2015  
INVENTOR(S) : Gerard E. Taylor Page 1 of 1

It is certified that error appears in the above-identified patent and that said Letters Patent is hereby corrected as shown below:

Specification

In column 2 at line 41, change "that that" to --that--.

Claims

In column 30 at line 16, in claim 13, change "that that" to --that--.

In column 30 at line 54, in claim 15, change "that that" to --that--.

Signed and Sealed this  
Twenty-first Day of June, 2016

Michelle K. Lee  
*Director of the United States Patent and Trademark Office*